US012684903B2

(12) United States Patent
Fujioka et al.

(10) Patent No.: US 12,684,903 B2
(45) Date of Patent: Jul. 14, 2026

(54) METHOD OF MANUFACTURING LIGHT-EMITTING ELEMENT AND LIGHT-EMITTING ELEMENT

(71) Applicant: NICHIA CORPORATION, Anan (JP)

(72) Inventors: Akira Fujioka, Tokushima (JP); Taku Yuasa, Anan (JP)

(73) Assignee: NICHIA CORPORATION, Anan (JP)

( * ) Notice: Subject to any disclaimer, the term of this patent is extended or adjusted under 35 U.S.C. 154(b) by 963 days.

(21) Appl. No.: 17/704,445

(22) Filed: Mar. 25, 2022

(65) Prior Publication Data

US 2022/0320369 A1      Oct. 6, 2022

(30) Foreign Application Priority Data

| Mar. 31, 2021 | (JP) | ................................. | 2021-059568 |
| Apr. 15, 2021 | (JP) | ................................. | 2021-068961 |
| Dec. 7, 2021 | (JP) | ................................. | 2021-198578 |

(51) Int. Cl.
*H10H 20/814* (2025.01)
*H10H 20/01* (2025.01)
(Continued)

(52) U.S. Cl.
CPC .......... *H10H 20/814* (2025.01); *H10H 20/01* (2025.01); *H10H 20/8312* (2025.01); *H10W 90/00* (2026.01); *H10H 20/032* (2025.01)

(58) Field of Classification Search
CPC .. A23B 2/721; H01L 25/0756; H10D 84/858; H10D 86/0227; H10H 20/01;
(Continued)

(56) References Cited

U.S. PATENT DOCUMENTS

| 2003/0052322 A1 | 3/2003 | Yamaguchi et al. |
| 2008/0131987 A1 | 6/2008 | Horino et al. |
| | (Continued) | |

FOREIGN PATENT DOCUMENTS

| JP | 2003-179301 A | 6/2003 |
| JP | 2008-140918 A | 6/2008 |
| | (Continued) | |

*Primary Examiner* — Meiya Li
(74) *Attorney, Agent, or Firm* — FOLEY & LARDNER LLP

(57) ABSTRACT

A method of manufacturing light-emitting elements includes: providing a wafer including a semiconductor stack, the semiconductor stack including: first semiconductor layer, an active layer on the first semiconductor layer, and a second semiconductor layer on the active layer, wherein the semiconductor stack includes element areas each including a part of the first semiconductor layer, a part of the active layer, and a part of the second semiconductor layer; forming a first reflection layer contiguously on or above (i) the second semiconductor layer in the element areas and (ii) the second semiconductor layer located between adjacent ones of the element areas; forming first masks covering parts of the first reflection layer that are on or above the second semiconductor layer in the element areas; and forming a groove that is located between the adjacent ones of the element areas and surrounds each of the plurality of element areas.

11 Claims, 46 Drawing Sheets

(51) Int. Cl.
  *H10H 20/831* (2025.01)
  *H10W 90/00* (2026.01)
(58) Field of Classification Search
  CPC .............. H10H 20/032; H10H 20/814; H10H
      20/8312; H10H 20/034; H10H 20/841;
      H10H 29/142; H10W 90/00
  See application file for complete search history.

(56) References Cited

U.S. PATENT DOCUMENTS

| | | | |
|---|---|---|---|
| 2010/0051987 A1 | 3/2010 | Katsuno et al. | |
| 2011/0049550 A1 | 3/2011 | Katsuno et al. | |
| 2011/0177633 A1* | 7/2011 | Iwayama ............. | H10H 20/018 |
| | | | 257/E33.057 |
| 2013/0015483 A1 | 1/2013 | Shimokawa et al. | |
| 2013/0105845 A1 | 5/2013 | Kim et al. | |
| 2015/0364643 A1 | 12/2015 | Sumitomo et al. | |
| 2016/0087149 A1* | 3/2016 | Miyachi ............. | A61K 40/4214 |
| | | | 362/509 |
| 2016/0149085 A1* | 5/2016 | Kashimoto ............ | A23B 2/792 |
| | | | 438/47 |

| | | | |
|---|---|---|---|
| 2016/0254253 A1 | 9/2016 | Meitl et al. | |
| 2017/0373228 A1 | 12/2017 | Chang et al. | |
| 2019/0067526 A1 | 2/2019 | Kim et al. | |
| 2019/0371777 A1 | 12/2019 | Iguchi | |
| 2020/0176655 A1 | 6/2020 | Iguchi et al. | |
| 2021/0126157 A1* | 4/2021 | Dupre ................... | H10F 77/206 |
| 2021/0343913 A1* | 11/2021 | Wang ................... | H10H 20/841 |

FOREIGN PATENT DOCUMENTS

| | | |
|---|---|---|
| JP | 2010-056322 A | 3/2010 |
| JP | 2010-123717 A | 6/2010 |
| JP | 2013-021175 A | 1/2013 |
| JP | 2013-098562 A | 5/2013 |
| JP | 2014-116439 A | 6/2014 |
| JP | 2014-120716 A | 6/2014 |
| JP | 2015-138836 A | 7/2015 |
| JP | 2016-015467 A | 1/2016 |
| JP | 2016-100489 A | 5/2016 |
| JP | 2018-503982 A | 2/2018 |
| JP | 2018-088535 A | 6/2018 |
| JP | 2020-088383 A | 6/2020 |
| JP | 6839320 B1 | 3/2021 |
| WO | WO-2011/027418 A1 | 3/2011 |

* cited by examiner

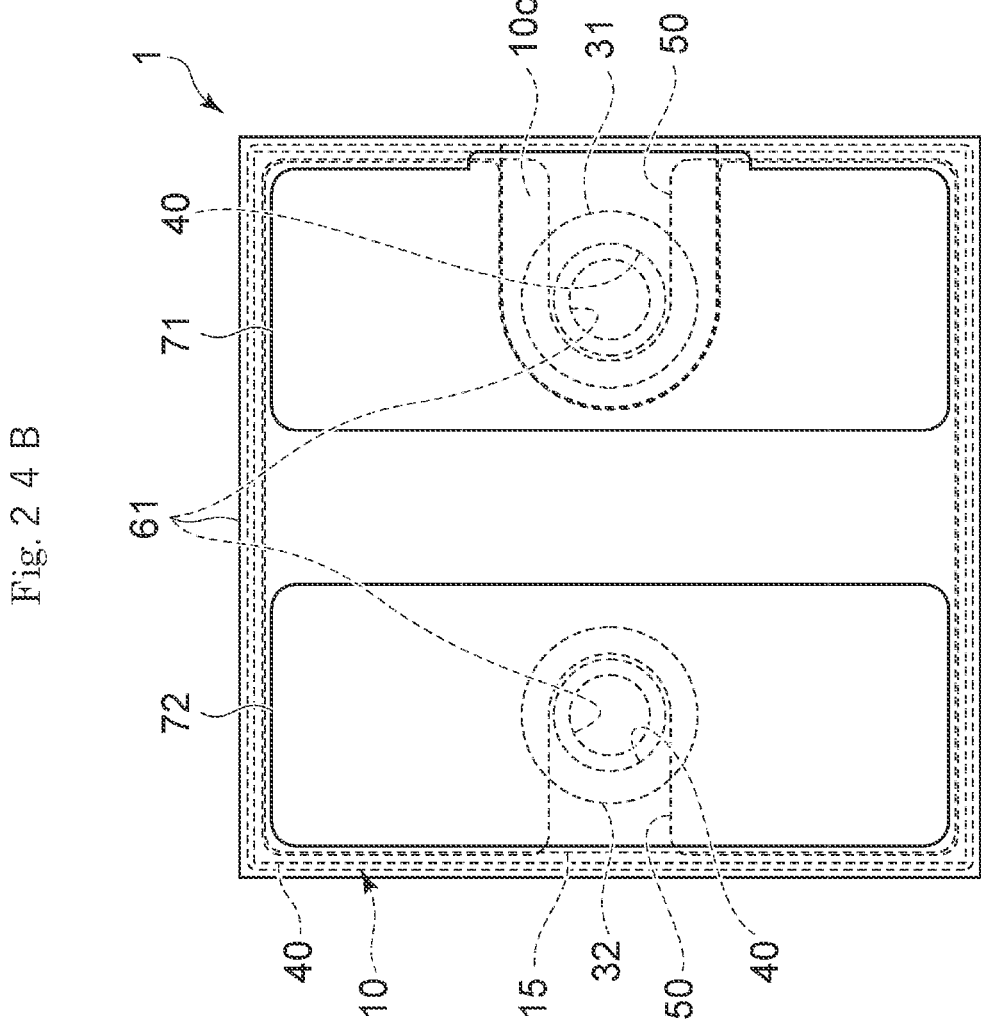
Fig. 2 4 B

Fig. 2 5 A
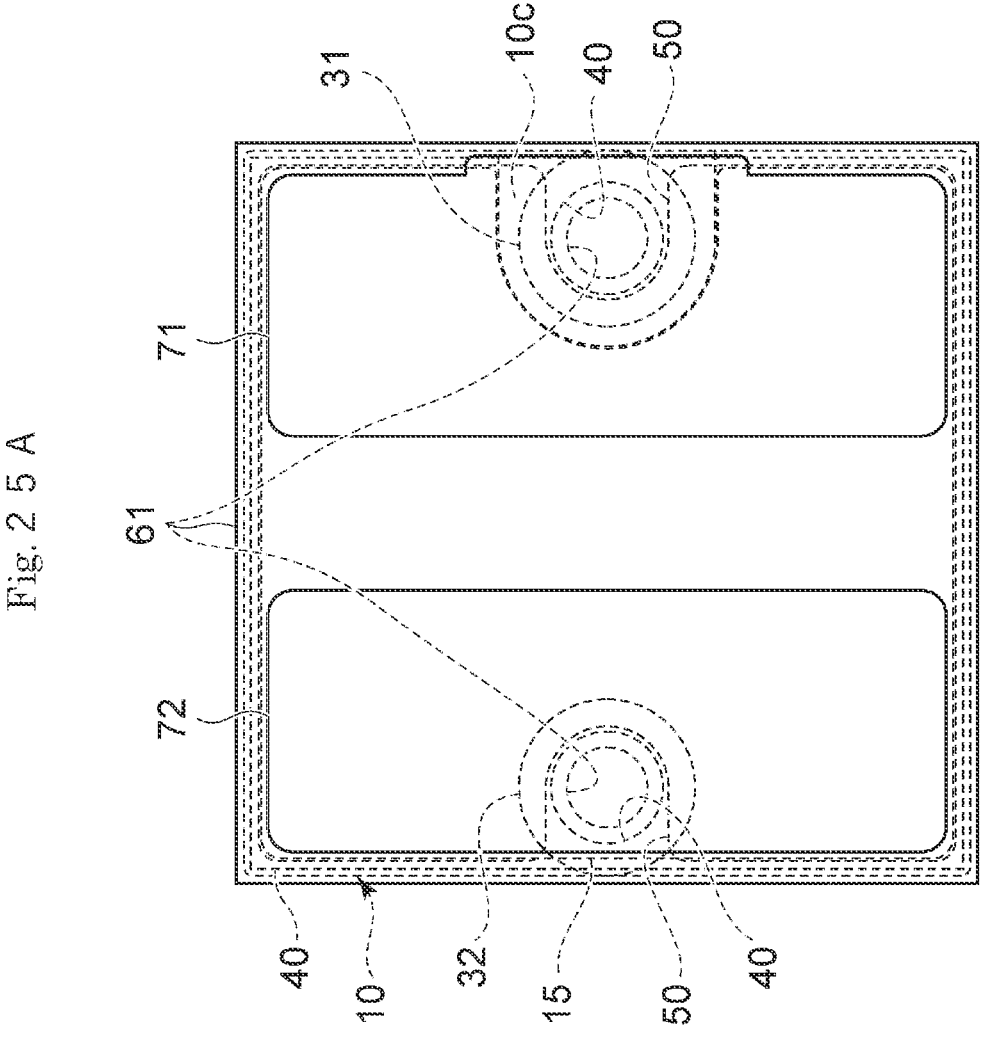

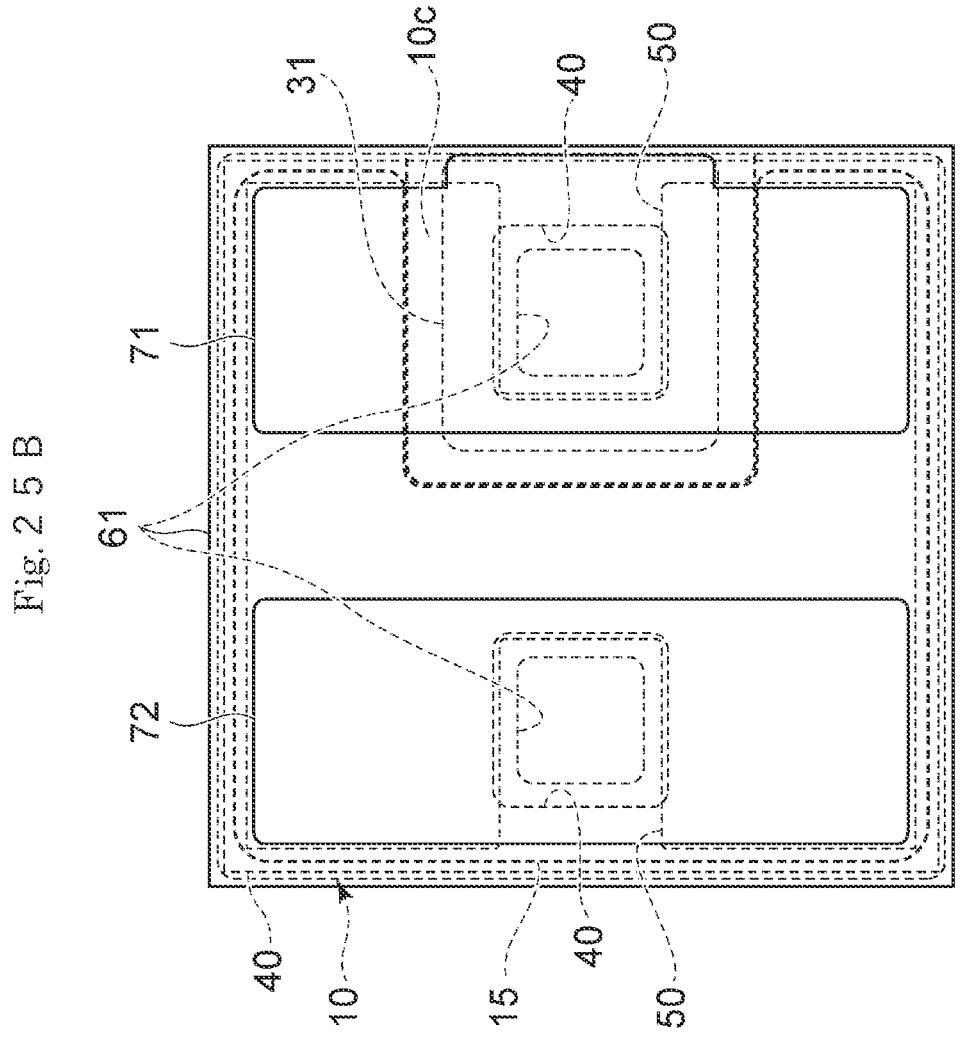
Fig. 2 5 B

Fig. 2 6 A

Fig. 2 6 B
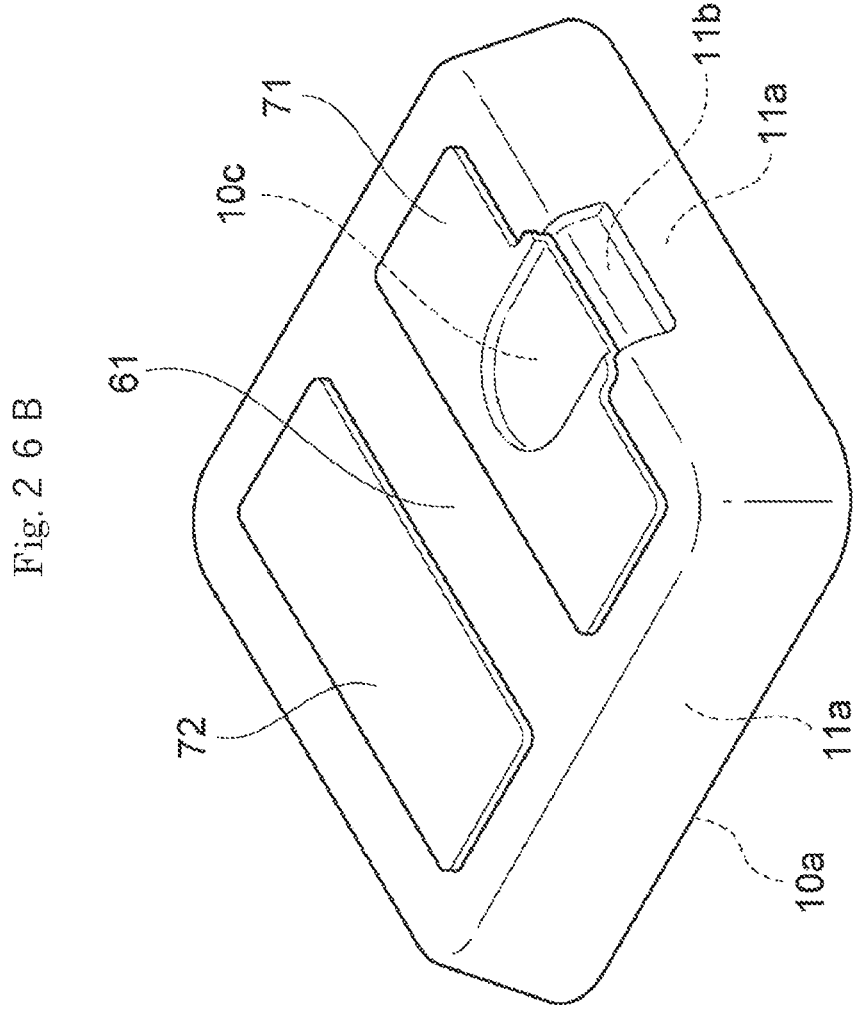

METHOD OF MANUFACTURING LIGHT-EMITTING ELEMENT AND LIGHT-EMITTING ELEMENT

CROSS-REFERENCE TO RELATED APPLICATIONS

The present application claims the benefit of priority to Japanese Patent Application No. 2021-059568, filed on Mar. 31, 2021, Japanese Patent Application No. 2021-068961 filed on Apr. 15, 2021, and Japanese Patent Application No. 2021-198578 filed on Dec. 7, 2021, the entire contents of which are incorporated herein by reference.

BACKGROUND

The present disclosure relates to a method of manufacturing light-emitting elements and to light-emitting elements.

Japanese Patent Publication No. 2013-21175 discloses that a light-emitting element may, for increased light extraction efficiency, include a reflection layer on a surface of a semiconductor stack opposite from a light-extracting surface thereof, and no reflection layer on the lateral surface of the semiconductor stack.

SUMMARY

An object of the present disclosure is to provide a method of manufacturing light-emitting elements each including a reflection layer on a surface of a semiconductor stack opposite from a light-extracting surface thereof, and no reflection layer on the lateral surface of the semiconductor stack, and to provide such light-emitting elements.

According to one embodiment, a method of manufacturing light-emitting elements comprises: providing a wafer comprising a semiconductor stack, the semiconductor stack comprising: a first semiconductor layer, an active layer on the first semiconductor layer, and a second semiconductor layer on the active layer, wherein the semiconductor stack comprises a plurality of mutually isolated element areas each comprising a part of the first semiconductor layer, a part of the active layer, and a part of the second semiconductor layer; forming a first reflection layer contiguously on or above (i) the second semiconductor layer in the plurality of element areas and (ii) the second semiconductor layer located between adjacent ones of the plurality of element areas; forming a plurality of first masks covering parts of the first reflection layer that are on or above the second semiconductor layer in the plurality of element areas; and forming a groove between the adjacent ones of the element areas, which comprises removing a part of the first reflection layer and a part of the semiconductor stack both located between adjacent ones of the first masks to expose the first semiconductor layer.

The method of manufacturing light-emitting elements and the light-emitting elements in accordance with the present disclosure can provide light-emitting elements each including a reflection layer on a surface of a semiconductor stack opposite from a light-extracting surface thereof, and no reflection layer on the lateral surface of the semiconductor stack.

BRIEF DESCRIPTION OF DRAWINGS

FIG. 11 is a schematic cross-sectional view taken along line XI-XI shown in FIG. 10.

FIG. 12 is a schematic plan view illustrating a method of manufacturing light-emitting elements in accordance with an embodiment of the present disclosure.

FIG. 13 is a schematic cross-sectional view taken along line XIII-XIII shown in FIG. 12.

FIG. 14 is a schematic cross-sectional view illustrating a method of manufacturing light-emitting elements in accordance with an embodiment of the present disclosure.

FIG. 15 is a schematic cross-sectional view illustrating a method of manufacturing light-emitting elements in accordance with an embodiment of the present disclosure.

FIG. 16 is a schematic plan view illustrating a method of manufacturing light-emitting elements in accordance with an embodiment of the present disclosure.

FIG. 20 is a schematic cross-sectional view illustrating a method of manufacturing light-emitting elements in accordance with an embodiment of the present disclosure.

FIG. 21 is a schematic cross-sectional view illustrating a method of manufacturing light-emitting elements in accordance with an embodiment of the present disclosure.

FIG. 22 is a schematic cross-sectional view illustrating a method of manufacturing light-emitting elements in accordance with an embodiment of the present disclosure.

FIG. 23 is a schematic cross-sectional view illustrating a method of manufacturing light-emitting elements in accordance with an embodiment of the present disclosure.

FIG. 25A is a schematic bottom view of a variation example of a light-emitting element in accordance with an embodiment of the present disclosure.

FIG. 25B is a schematic bottom view of a variation example of a light-emitting element in accordance with an embodiment of the present disclosure.

FIG. 26A is a schematic perspective view of a light-emitting element in accordance with an embodiment of the present disclosure as viewed from the side thereof on which a conductive member is provided.

FIG. 26B is a schematic perspective view of a variation example of a light-emitting element in accordance with an embodiment of the present disclosure as viewed from the side thereof on which a conductive member is provided.

FIG. 27 is a schematic cross-sectional view illustrating a method of manufacturing light-emitting elements in accordance with an embodiment of the present disclosure.

FIG. 28 is a schematic cross-sectional view illustrating a method of manufacturing light-emitting elements in accordance with an embodiment of the present disclosure.

FIG. 29 is a schematic cross-sectional view illustrating a method of manufacturing light-emitting elements in accordance with an embodiment of the present disclosure.

FIG. 31 is a schematic cross-sectional view illustrating a method of manufacturing light-emitting elements in accordance with an embodiment of the present disclosure.

FIG. 32 is a schematic cross-sectional view illustrating a method of manufacturing light-emitting elements in accordance with an embodiment of the present disclosure.

FIG. 34 is a schematic plan view illustrating a method of manufacturing light-emitting elements in accordance with an embodiment of the present disclosure.

FIG. 35 is a schematic cross-sectional view taken along line XXXV-XXXV shown in FIG. 34.

FIG. 36 is a schematic plan view illustrating a method of manufacturing light-emitting elements in accordance with an embodiment of the present disclosure.

FIG. 37 is a schematic cross-sectional view taken along line XXXVII-XXXVII shown in FIG. 36.

FIG. 39 is a schematic cross-sectional view taken along line XXXIX-XXXIX shown in FIG. 38.

FIG. 41 is a schematic cross-sectional view taken along line XLI-XLI shown in FIG. 40.

FIG. 42 is a schematic plan view illustrating a method of manufacturing light-emitting elements in accordance with an embodiment of the present disclosure.

FIG. 43 is a schematic cross-sectional view taken along line XLIII-XLIII shown in FIG. 42.

DETAILED DESCRIPTION

Figure 1:
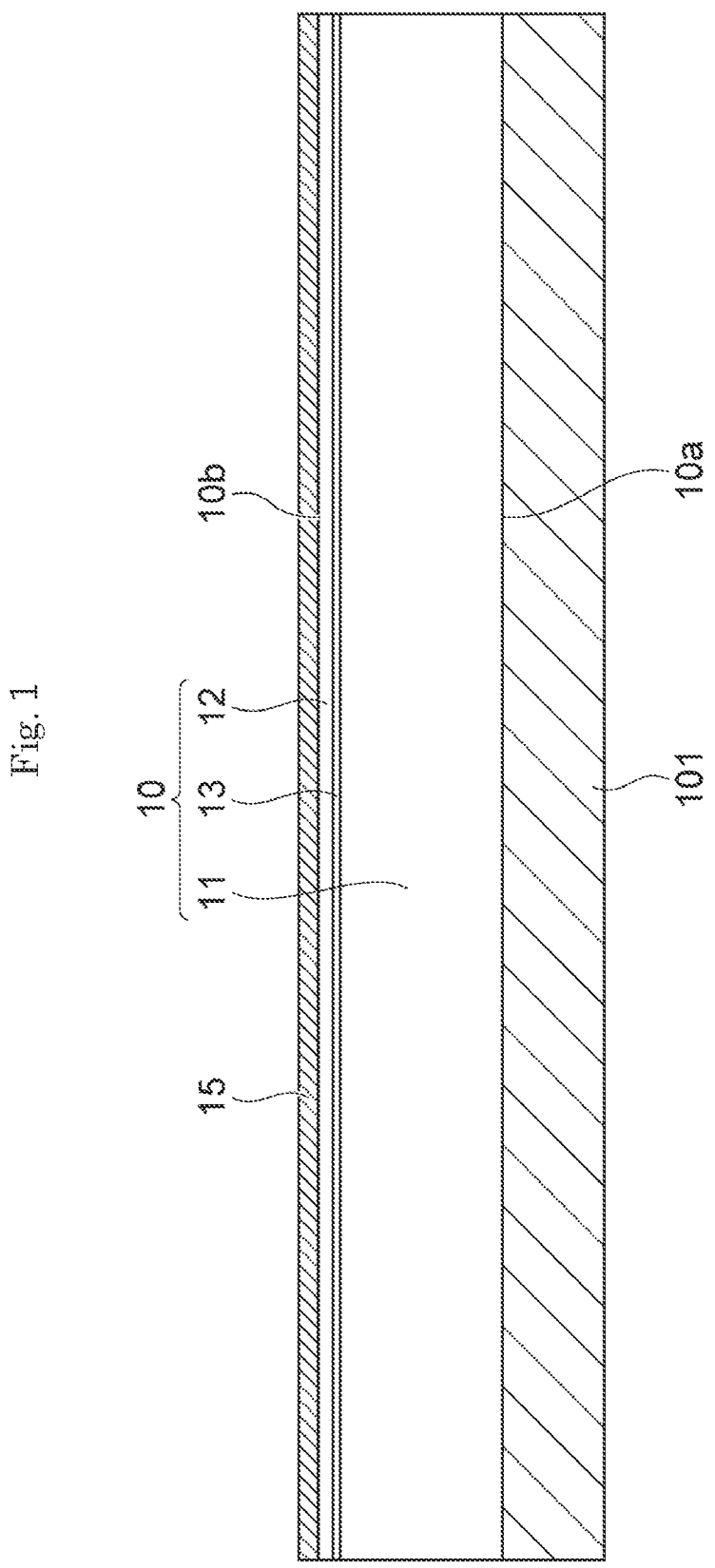
FIG. 1 is a schematic cross-sectional view illustrating a method of manufacturing light-emitting elements in accordance with an embodiment of the present disclosure.

Embodiments of the present disclosure are described below with reference to drawings. Identical members are denoted by the same reference numerals throughout the drawings. End views showing only a cross-section of a particular member may be used in place of cross-sectional views thereof.

Figure 5:
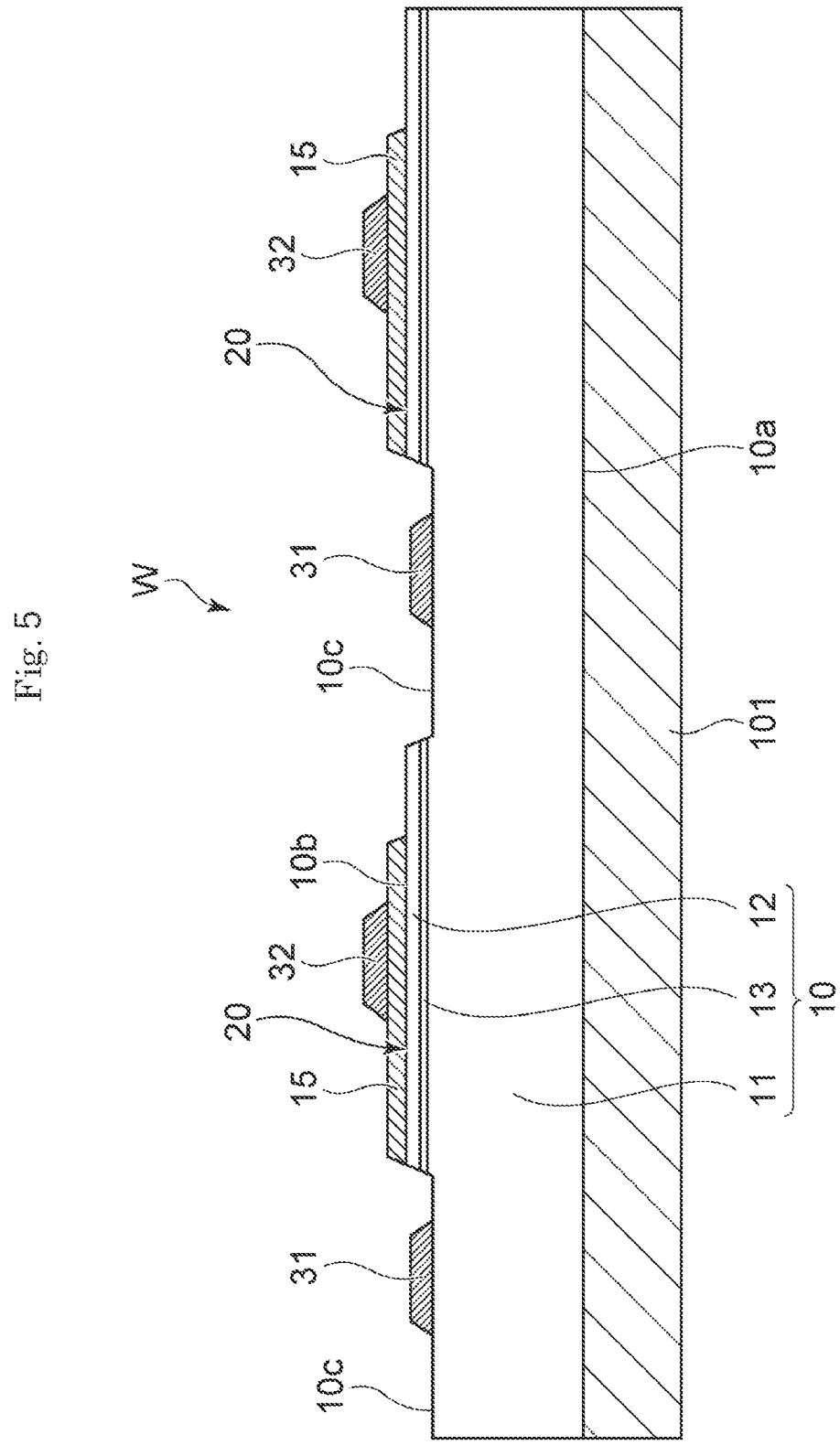
FIG. 5 is a schematic cross-sectional view taken along line V-V shown in FIG. 4.

A method of manufacturing light-emitting elements in accordance with an embodiment of the present disclosure includes a step of providing a wafer W shown in FIG. 5. The step of providing the wafer W includes a step of forming a semiconductor stack 10 on a first substrate 101 as shown in FIG. 1.

The semiconductor stack 10 contains, for example, a nitride semiconductor such as $In_xAl_yGa_{1-x-y}N$ ($0 \leq x$, $0 \leq y$, $x+y \leq 1$). The first substrate 101 may be an insulating substrate composed primarily of, for example, sapphire with a principal plane being C-plane, R-plane, or A-plane or spinel ($MgAl_2O_4$). Alternatively, the first substrate 101 may be a conductive substrate composed primarily of, for example, SiC (including 6H, 4H, or 3C), ZnS, ZnO, GaAs, or Si.

The semiconductor stack 10 includes: a first semiconductor layer 11, an active layer 13 on the first semiconductor layer 11, and a second semiconductor layer 12 on the active layer 13. In FIG. 1, the bottom surface of the first semiconductor layer 11 is referred to as a first surface 10*a* of the semiconductor stack 10, and the top surface of the second semiconductor layer 12 is referred to as a second surface 10*b* of the semiconductor stack 10. In the present embodiment, the first semiconductor layer 11 is an n-side semiconductor layer, whilst the second semiconductor layer 12 is a p-side semiconductor layer. The active layer 13 is a light-emitting layer that emits light. The active layer 13 includes a plurality of barrier layers and a plurality of well layers and may have a multiple quantum well structure that includes alternately stacked barrier layers and well layers.

The first semiconductor layer 11, the active layer 13, and the second semiconductor layer 12 are formed in this order the first substrate 101 by, for example, MOCVD (metal organic chemical vapor deposition). The step of providing the wafer W may alternatively include a step of purchasing a wafer including a semiconductor stack 10 already formed on a first substrate 101.

There may be provided a conductive, current diffusion layer 15 on the second surface 10*b* of the semiconductor stack 10 (i.e., on the top surface of the second semiconductor layer 12). The current diffusion layer 15 is formed by, for example, sputtering or vapor deposition. Materials of the current diffusion layer 15 may include, for example, an oxide film, such as ITO (indium tin oxide), AZO (aluminum zinc oxide), IZO (indium zinc oxide), or $Ga_2O_3$. The current diffusion layer 15 diffuses the electric current supplied via a second electrode detailed later in the in-plane direction of the second semiconductor layer 12.

Figure 2:
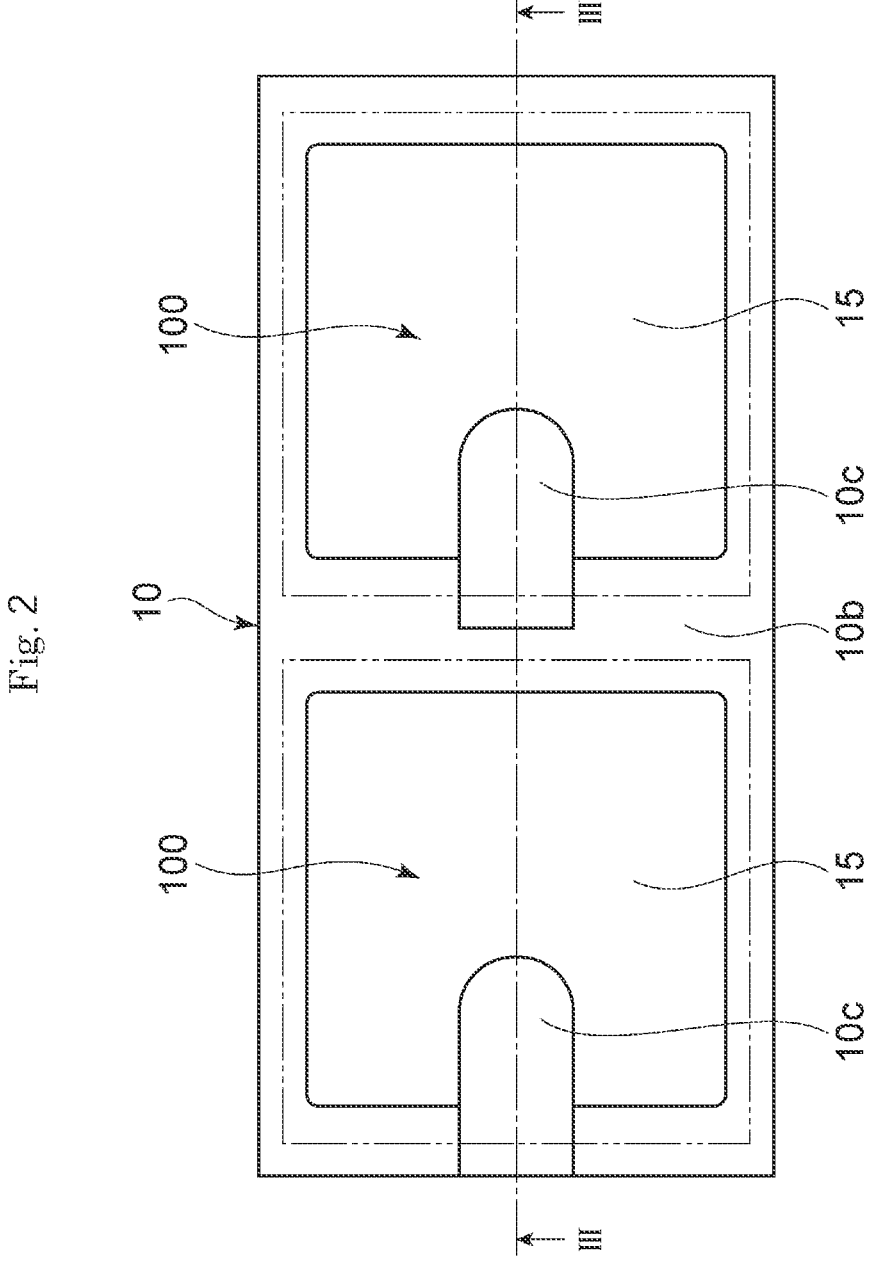
FIG. 2 is a schematic plan view illustrating a method of manufacturing light-emitting elements in accordance with an embodiment of the present disclosure.
Figure 3:
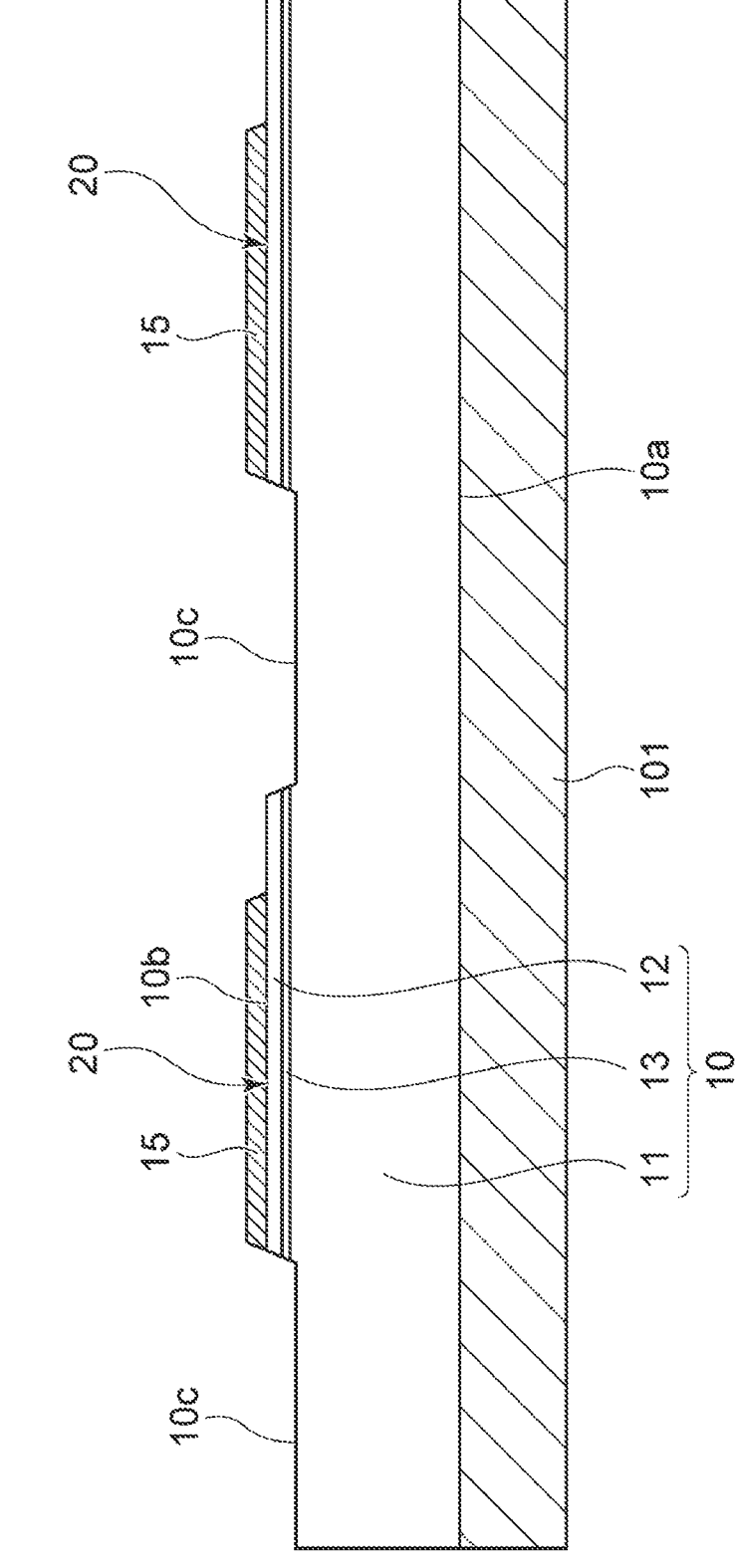
FIG. 3 is a schematic cross-sectional view taken along line III-III shown in FIG. 2.

The method then proceeds to the step illustrated in FIGS. 2 and 3.

FIG. 2 is a schematic plan view of the semiconductor stack 10 as viewed from the side thereof on which the second surface 10*b* resides. FIG. 3 is a schematic cross-sectional view taken along line III-III shown in FIG. 2.

The current diffusion layer 15, the second semiconductor layer 12, and the active layer 13 are partially removed by, for example, RIE (reactive ion etching) to expose parts of the first semiconductor layer 11 from the current diffusion layer 15, the second semiconductor layer 12, and the active layer 13. The gas used in RIE to partially remove the second semiconductor layer 12 and the active layer 13 may contain, for example, chlorine ($Cl_2$) or silicon tetrachloride ($SiCl_4$). The exposed parts of the first semiconductor layer 11 are referred to as third surfaces 10*c* of the semiconductor stack 10. Protrusions 20 are formed on the semiconductor stack 10 simultaneously with the third surfaces 10c. Each protrusion 20 includes the first semiconductor layer 11, the active layer 13, and the second semiconductor layer 12.

The current diffusion layer 15 on the top surface of the second semiconductor layer 12 (i.e., on the second surface 10b of the semiconductor stack 10) in the protrusions 20 is partially removed to expose parts of the top surface of the second semiconductor layer 12 (i.e., the second surface 10b of the semiconductor stack 10) from the current diffusion layer 15. The current diffusion layer 15 is divided into a plurality of mutually isolated portions in a plan view as shown in FIG. 2.

The semiconductor stack 10 has a plurality of mutually isolated element areas 100. FIG. 2 uses a dash-double-dot line to indicate a line that delimits each element area 100. FIG. 2 shows, as an example, an area in which two of the element areas 100 are included.

Each element area 100 includes a part of the first semiconductor layer 11, a part of the active layer 13, and a part of the second semiconductor layer 12. The current diffusion layer 15 is divided for each individual element area 100. The space between each pair of adjacent element areas 100 provides a groove-forming region where a groove will be formed in a step detailed later. The third surface 10c may be partially contiguously provided from the element area 100 to this groove-forming region as shown in FIG. 2.

Figure 4:
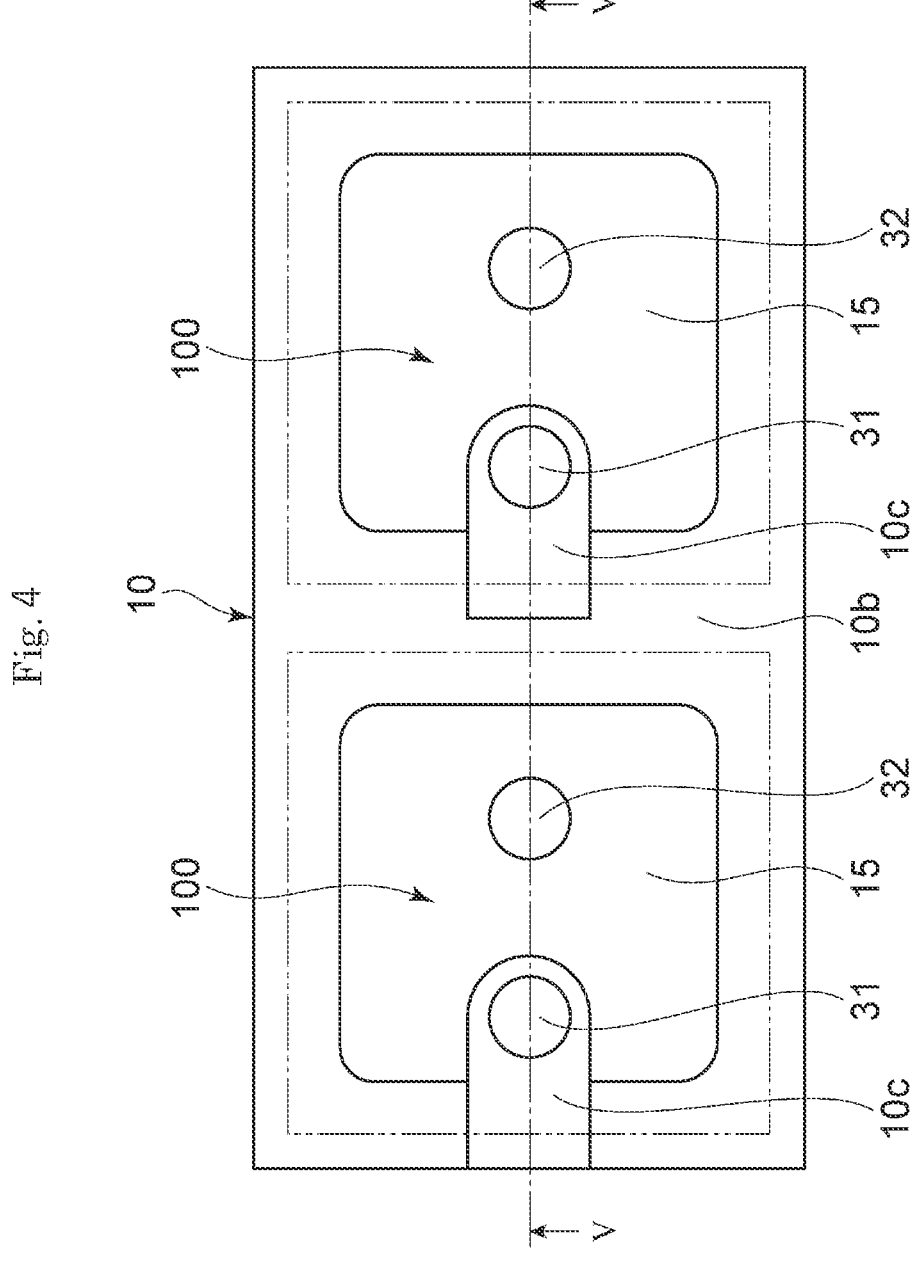
FIG. 4 is a schematic plan view illustrating a method of manufacturing light-emitting elements in accordance with an embodiment of the present disclosure.

The method then proceeds to the step illustrated in FIGS. 4 and 5.

FIG. 4 is a schematic plan view showing the same area as FIG. 2. FIG. 5 is a schematic cross-sectional view taken along line V-V shown in FIG. 4.

A first electrode 31 is formed on the third surface 10c, which is a part of the first semiconductor layer 11 in the element area 100. A second electrode 32 is formed on the current diffusion layer 15 on the second surface 10b, which is a part of the second semiconductor layer 12 in the element area 100. The first electrode 31 and the second electrode 32 are formed by, for example, sputtering or vapor deposition. Alternatively, only the current diffusion layer 15 may be used as the second electrode.

Each of the first electrode 31 and the second electrode 32 is, for example, either a single layer of metal comprising Ti, Rh, Au, Pt, Al, Ag, Rh, or Ru or a multi-layer comprising at least two of these metals.

The steps described so far provide the wafer W including the first substrate 101, the semiconductor stack 10, the current diffusion layer 15, the first electrode 31, and the second electrode 32.

Figure 6:
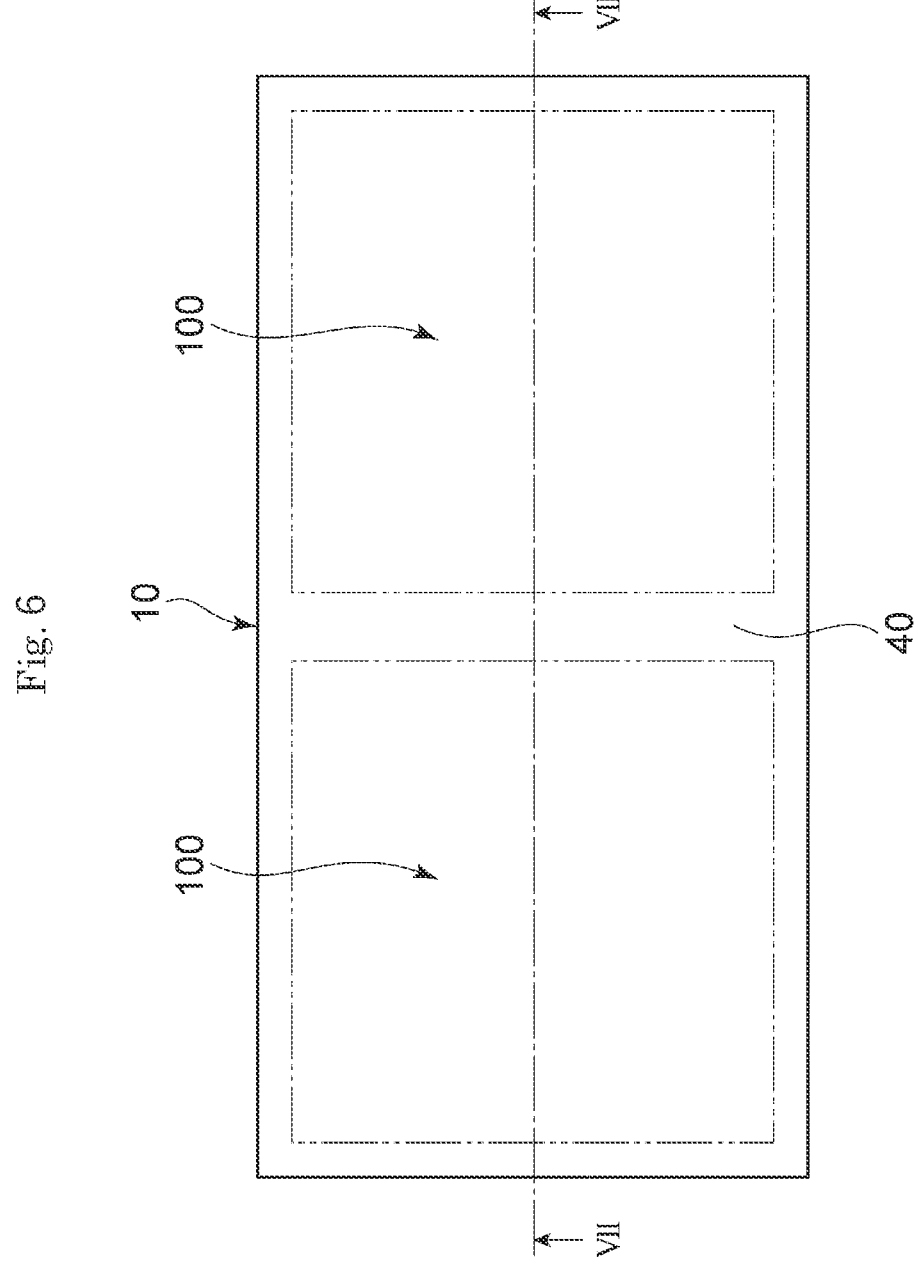
FIG. 6 is a schematic plan view illustrating a method of manufacturing light-emitting elements in accordance with an embodiment of the present disclosure.
Figure 7:
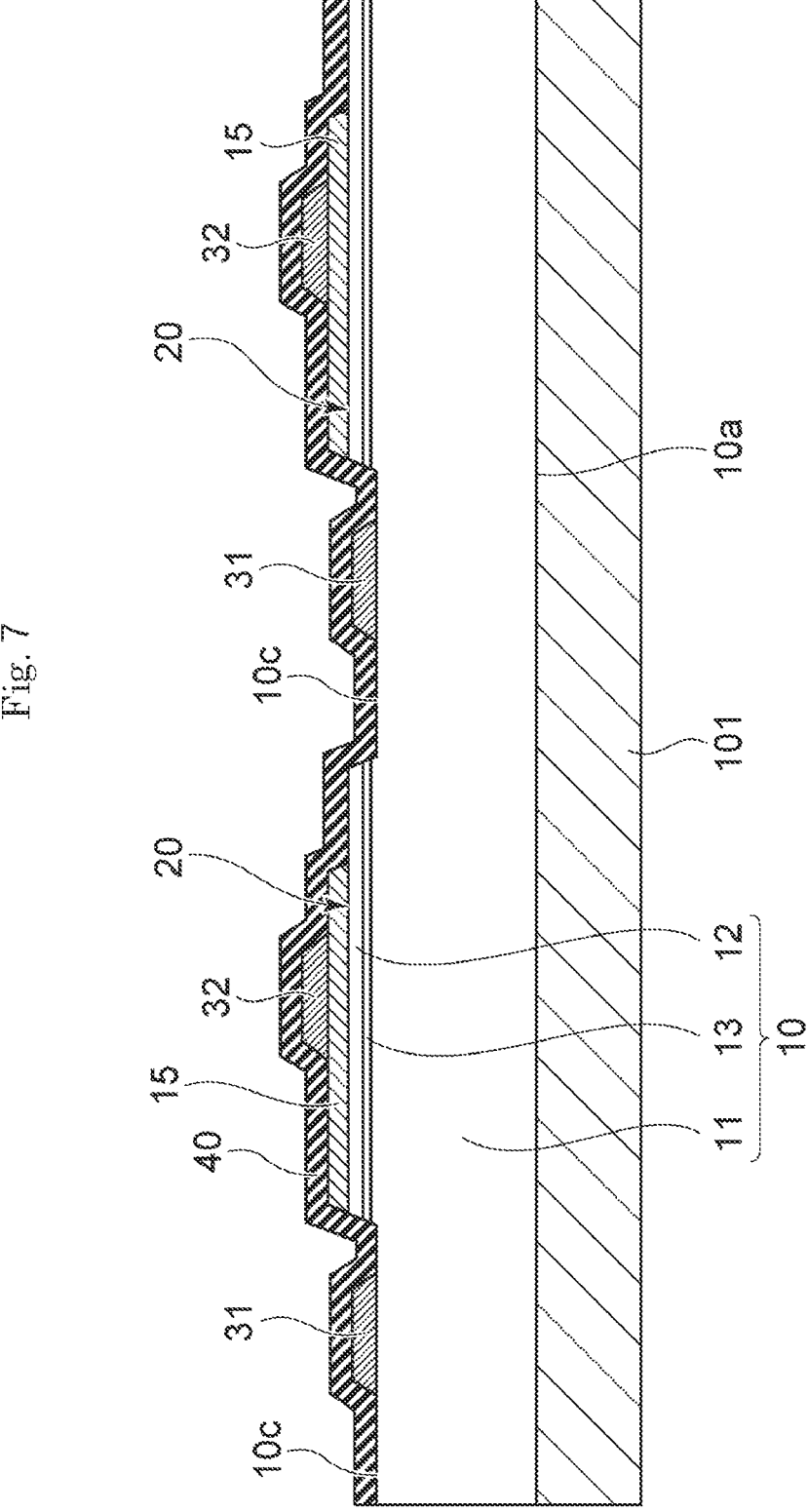
FIG. 7 is a schematic cross-sectional view taken along line VII-VII shown in FIG. 6.

The method then proceeds to the step illustrated in FIGS. 6 and 7.

FIG. 6 is a schematic plan view showing the same area as FIG. 2. FIG. 7 is a schematic cross-sectional view taken along line VII-VII shown in FIG. 6.

A first reflection layer 40 is formed on the top surface of the wafer W shown in FIG. 5. The first reflection layer 40 is provided contiguously on the semiconductor stack 10 in the element areas 100 and on the semiconductor stack 10 between the adjacent element areas 100. The first reflection layer 40 covers the top and lateral surfaces of the protrusions 20. The first reflection layer 40 covers the third surfaces 10c. The first reflection layer 40 further covers the top and lateral surfaces of the current diffusion layer 15. The first reflection layer 40 is provided contiguously on the first electrodes 31 and the second electrodes 32. The first reflection layer 40 covers the top surfaces of the first electrodes 31, the lateral surfaces of the first electrodes 31, the top surfaces of the second electrodes 32, and the lateral surfaces of the second electrodes 32.

The first reflection layer 40 reflects the light from the active layer 13. The first reflection layer 40 includes, for example, a dielectric multilayer film that in turn includes, for example, alternately stacked silicon dioxide ($SiO_2$) layers and niobium pentoxide ($Nb_2O_5$) layers. The first reflection layer 40 is preferably provided by, for example, forming a $SiO_2$ layer having a relatively large thickness of from 100 nm to 500 nm, and subsequently forming two to six pairs of $Nb_2O_5$ and $SiO_2$ layers as the dielectric multilayer film on this $SiO_2$ layer, each pair including a $Nb_2O_5$ layer having a thickness of from 10 nm to 100 nm, and a $SiO_2$ layer having a thickness of from 10 nm to 100 nm. This specification of the thickness of each layer in the first reflection layer 40 and of the number of those layers can deliver good light-reflecting properties. The first reflection layer 40 may be provided by, for example, forming a 300-nm thick $SiO_2$ layer and subsequently forming three pairs of $Nb_2O_5$ and $SiO_2$ layers on this $SiO_2$ layer, each pair including a 52-nm thick $Nb_2O_5$ layer and an 83-nm thick $SiO_2$ layer. Alternatively, the first reflection layer 40 may contain titanium oxide ($TiO_2$), zirconium oxide ($ZrO_2$), aluminum oxide ($Al_2O_3$), aluminum nitride (AlN), or a like material. The first reflection layer 40 is formed by, for example, CVD (chemical vapor deposition) or sputtering.

Figure 8:
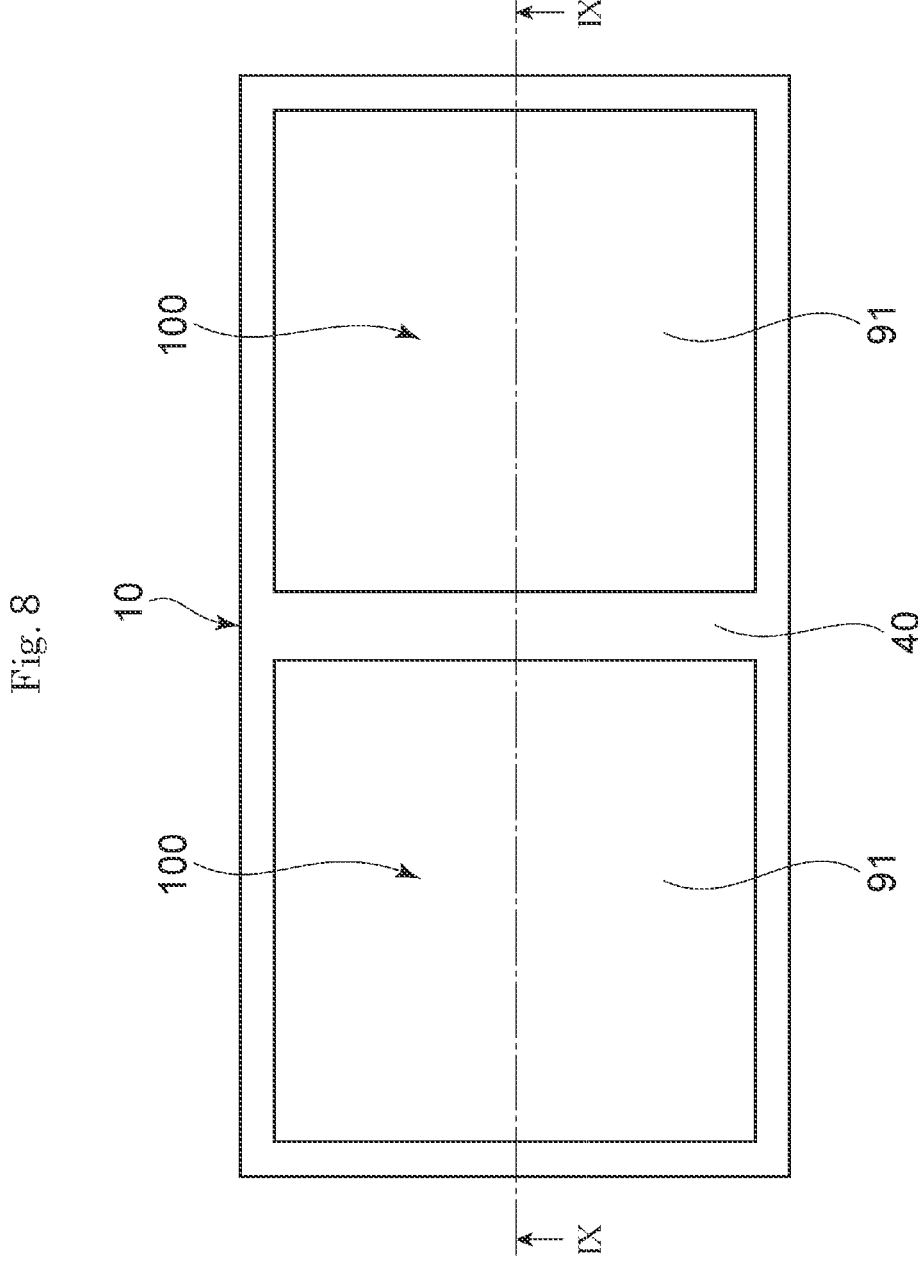
FIG. 8 is a schematic plan view illustrating a method of manufacturing light-emitting elements in accordance with an embodiment of the present disclosure.
Figure 9:
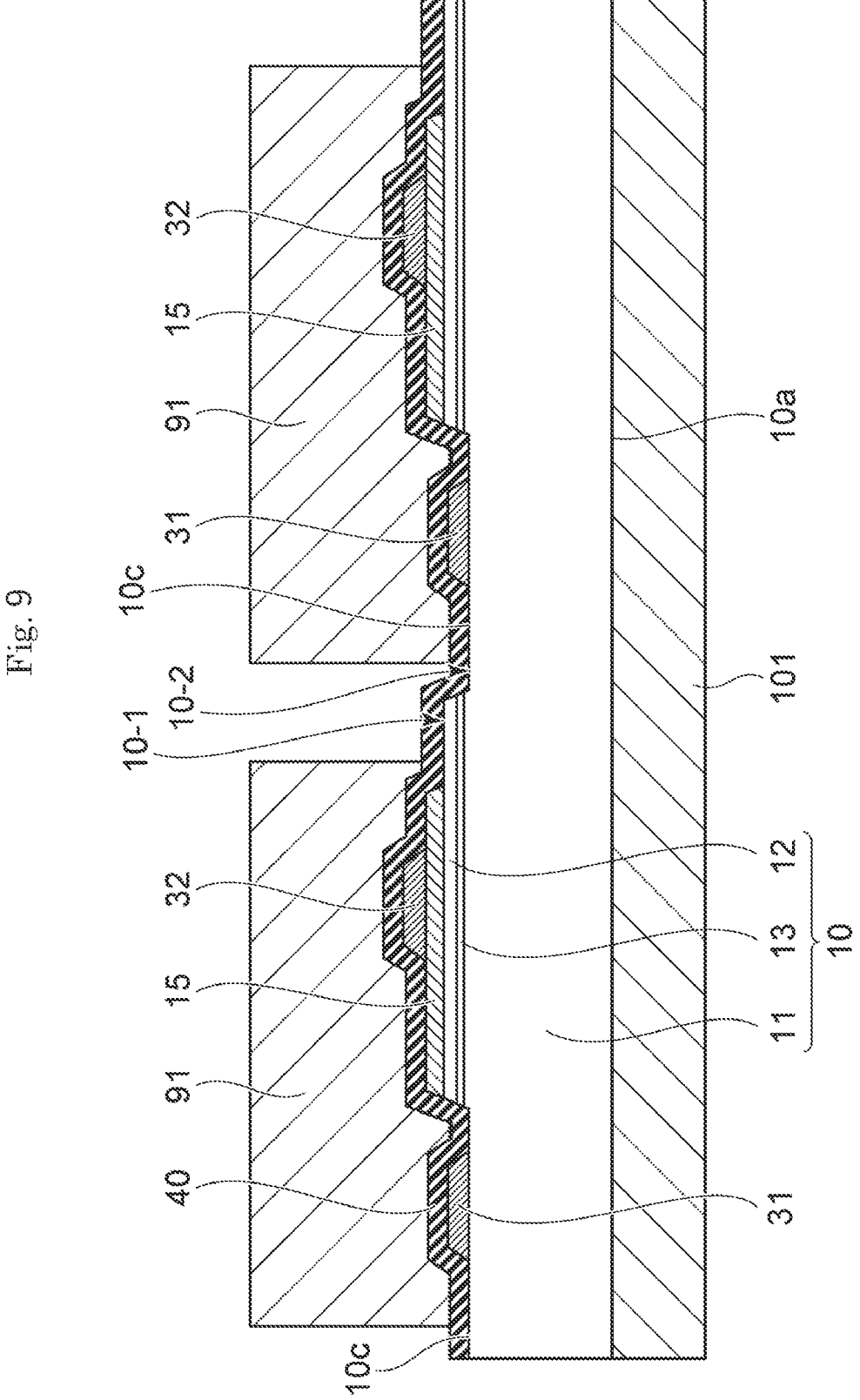
FIG. 9 is a schematic cross-sectional view taken along line IX-IX shown in FIG. 8.

The method then proceeds to the step illustrated in FIGS. 8 and 9.

FIG. 8 is a schematic plan view showing the same area as FIG. 2. FIG. 9 is a schematic cross-sectional view taken along line IX-IX shown in FIG. 8.

A plurality of first masks 91 is formed covering the first reflection layer 40 above the element areas 100 of the semiconductor stack 10. The first masks 91 are isolated from each other in a plan view as shown in FIG. 8. The footprint of the first mask 91 approximately matches the element area 100. The parts of the first reflection layer 40 that are located between the adjacent element areas 100 (i.e., between the adjacent first masks 91) are exposed outside the first masks 91. The first masks 91 are, for example, photoresist masks.

Figure 10:
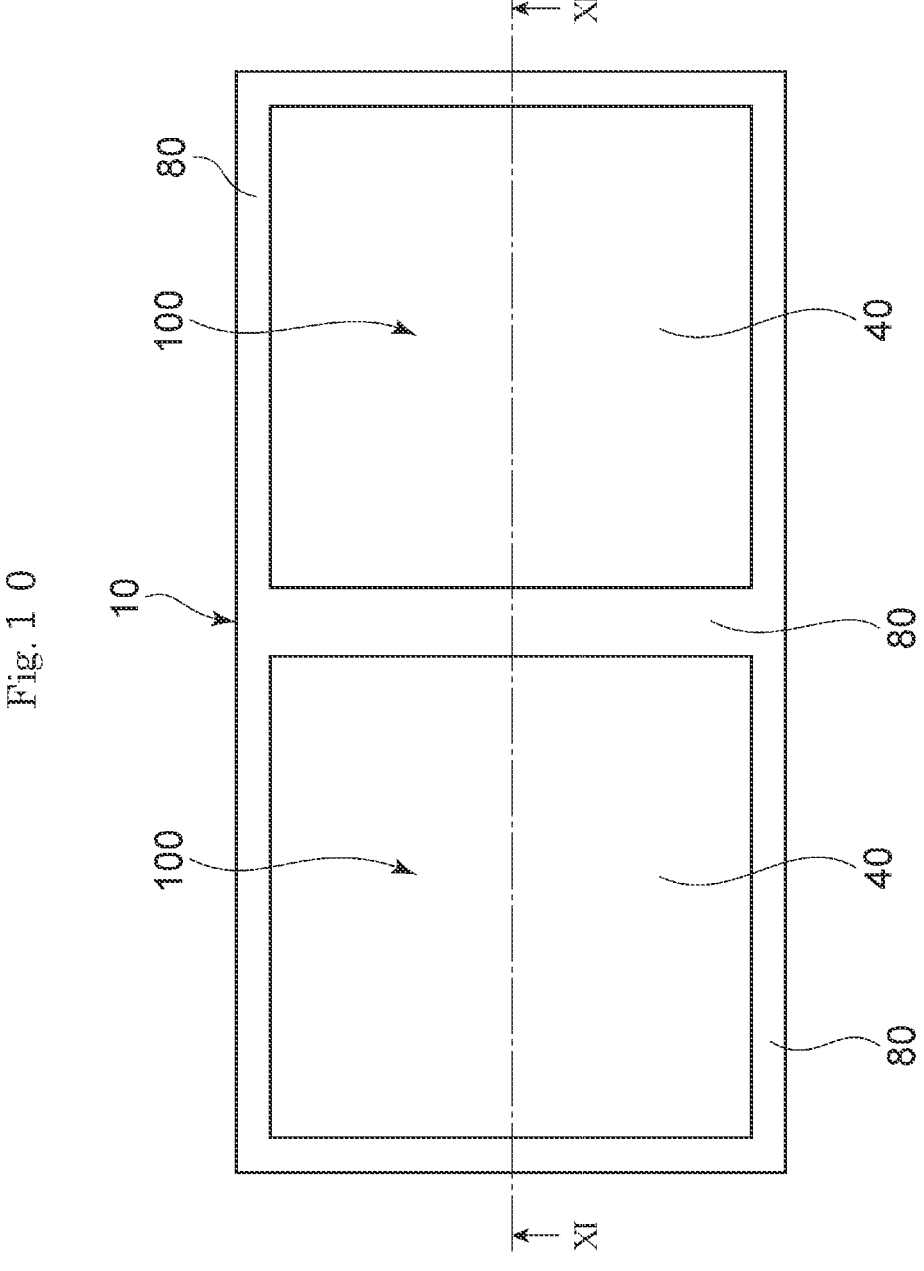
FIG. 10 is a schematic plan view illustrating a method of manufacturing light-emitting elements in accordance with an embodiment of the present disclosure.
Figure 1:
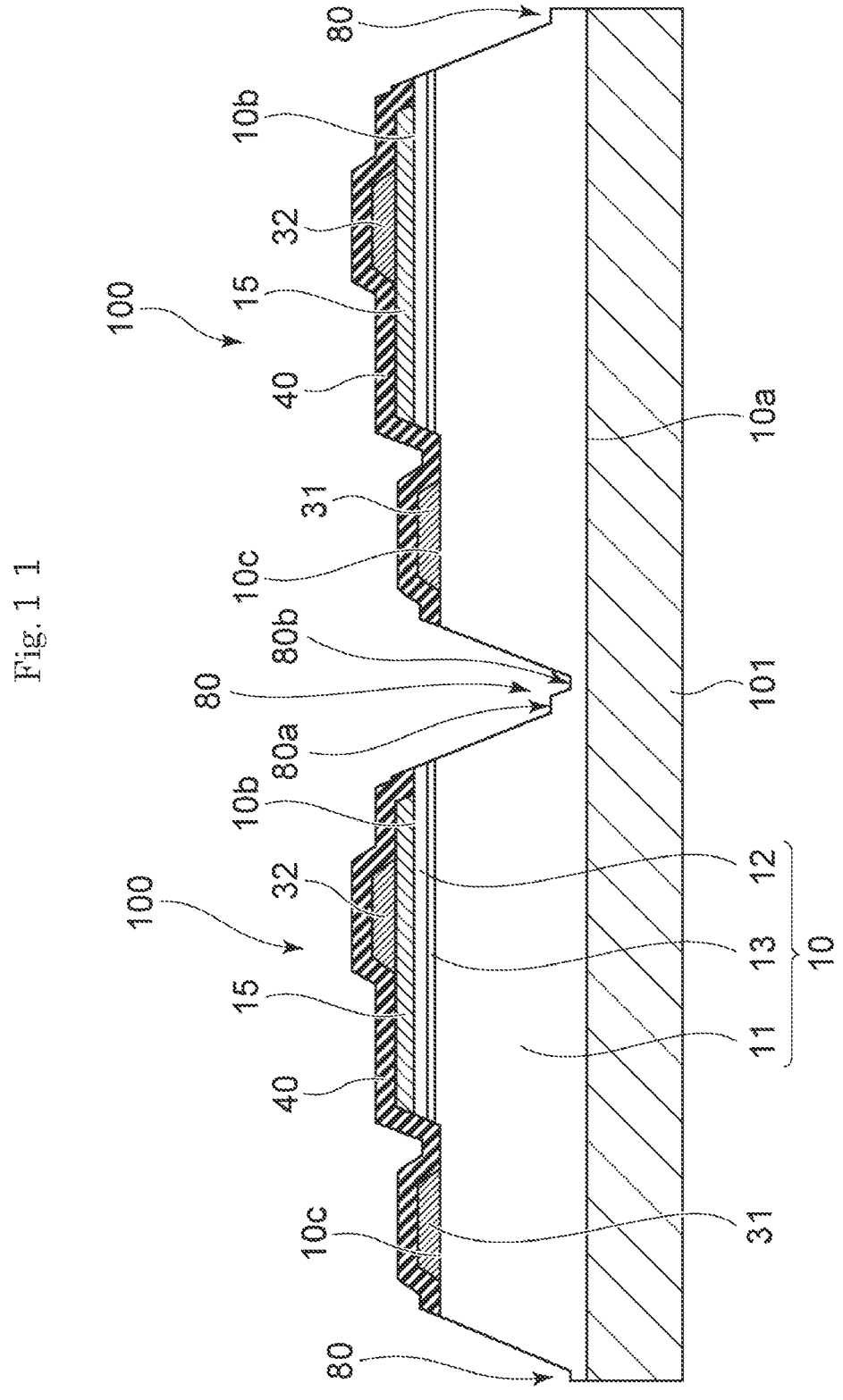
Figure 1:
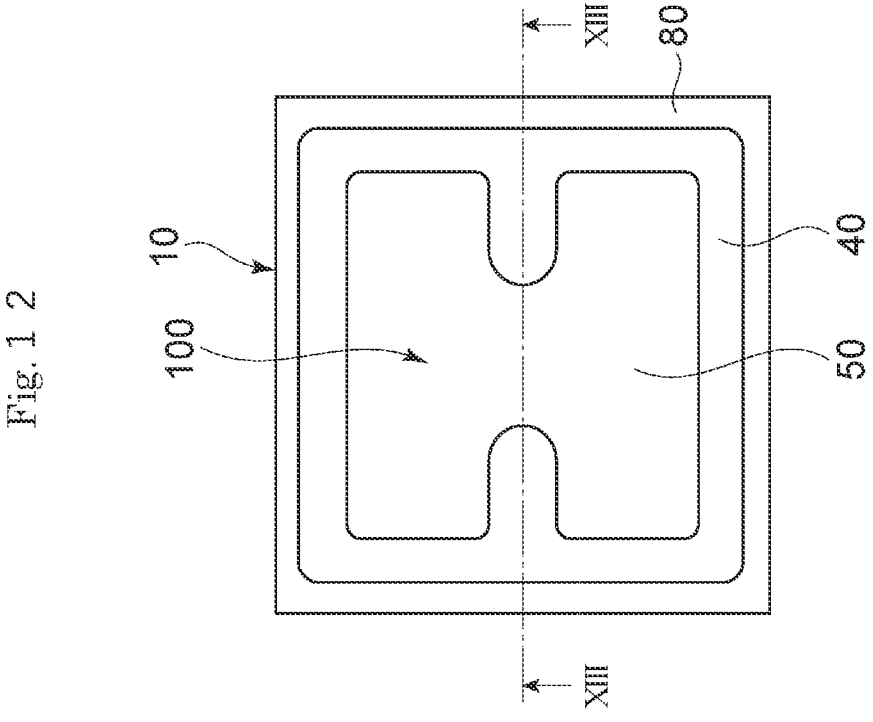
Figure 1:
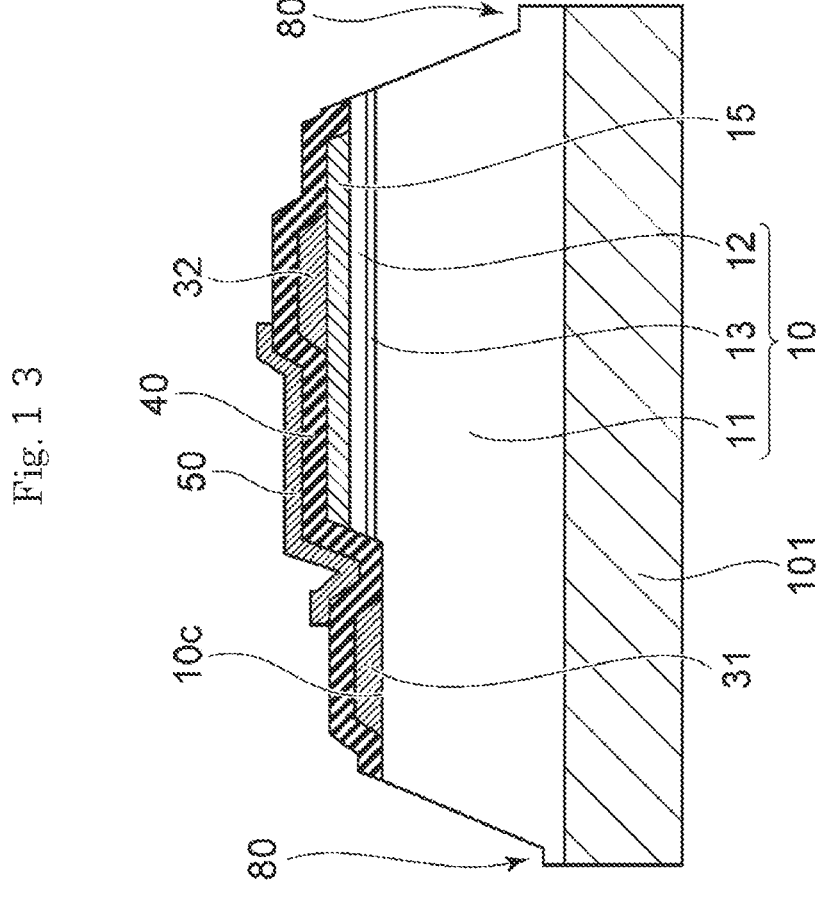
Figure 1:
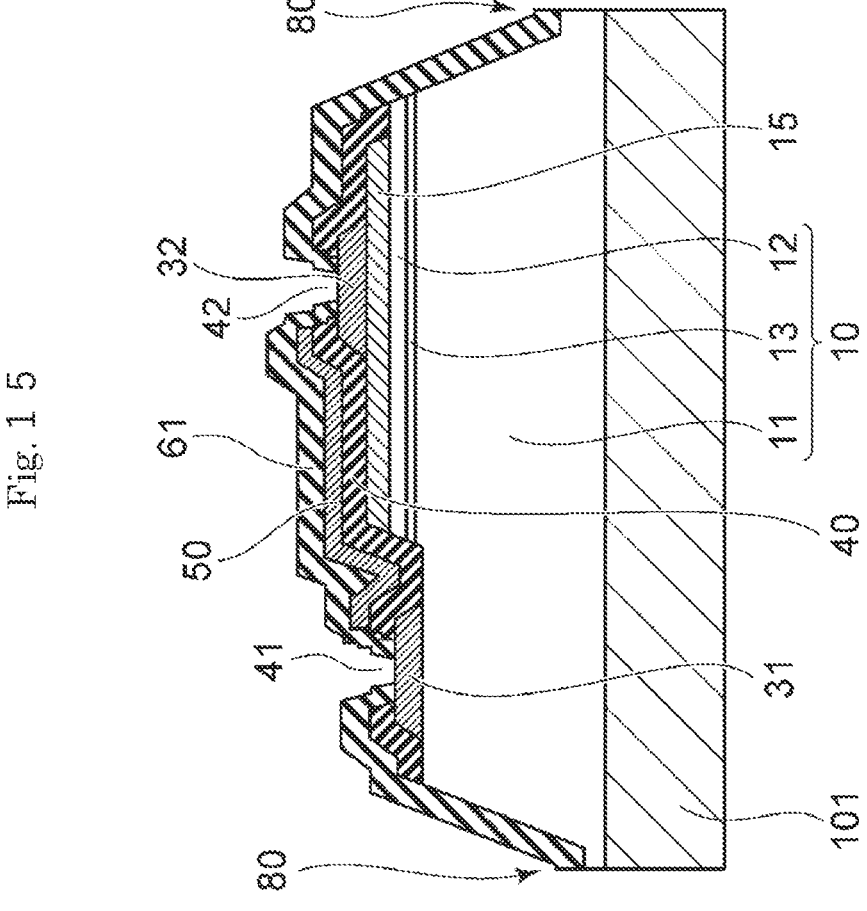
Figure 1:
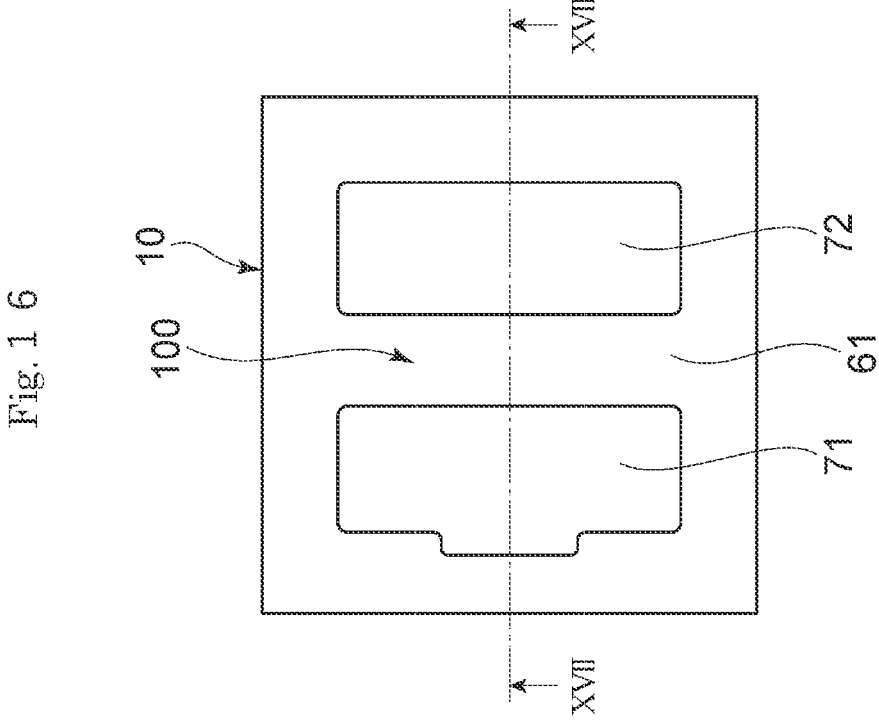

The method then proceeds to the step illustrated in FIGS. 10 and 11.

FIG. 10 is a schematic plan view showing the same area as FIG. 2. FIG. 11 is a schematic cross-sectional view taken along line XI-XI shown in FIG. 10.

The first reflection layer 40 and parts of the semiconductor stack 10 are removed from the regions between the adjacent first masks 91 formed in the step described above in such a manner to expose the first semiconductor layer 11. This removal forms a groove 80 in the semiconductor stack 10 between the adjacent element areas 100.

The groove 80 surrounds the element areas 100. The groove 80 may be provided so as to not extend through the semiconductor stack 10, short of reaching the first substrate 101, as shown in FIG. 11.

In the step of forming the groove 80, the first reflection layer 40 and the parts of the semiconductor stack 10 between the adjacent element areas 100 are removed by, for example, RIE. The step of forming the groove 80 by RIE includes: a step of removing the first reflection layer 40 from the regions between the first masks 91 by first etching using a first gas containing fluorine, and a step of partially removing the semiconductor stack 10 from the regions between the first masks 91 by second etching using a second gas containing chlorine. The first gas contains, for example, carbon tetrafluoride ($CF_4$) and/or fluoroform ($CHF_3$). The second gas contains, for example, $Cl_2$ and/or $SiCl_4$.

Referring to FIG. 9, the semiconductor stack 10 in each region between the adjacent first masks 91 includes: a first portion 10-1 including the first semiconductor layer 11, the active layer 13, and the second semiconductor layer 12; and a second portion 10-2 including only the first semiconductor layer 11. There is a level difference between the first portion 10-1 and the second portion 10-2. This structure results in a level difference on the bottom surface defining the groove 80 formed by RIE, as shown in FIG. 11. Inside the groove 80, a second area 80b formed by etching out the second portion 10-2 has a larger depth than does a first area 80a formed by etching out the first portion 10-1. The first area 80a and the second area 80b differ in depth by, for example, from 0.5 μm to 5 μm.

In the semiconductor stack 10, the thickness of a portion between the first surface 10a and the bottom surface defining the groove 80 (the bottom surface of the first area 80a and the bottom surface of the second area 80b) is less than the thickness of a portion between the first surface 10a and the third surface 10c and between the first surface 10a and the second surface 10b.

The groove 80 may alternatively be provided so as to extend through the semiconductor stack 10, reaching the first substrate 101, in which case the first semiconductor layer 11 is likewise exposed on the lateral surface(s) of the groove 80.

The method then proceeds to the step illustrated in FIGS. 12 and 13.

FIG. 12 is a schematic plan view of one of the two element areas 100 shown in, for example, FIG. 2. Drawings related to the subsequent steps similarly show a single element area. FIG. 13 is a schematic cross-sectional view taken along line XIII-XIII shown in FIG. 12.

A second reflection layer 50 is formed on the first reflection layer 40 by a method detailed later. The second reflection layer 50 is, for example, a metal layer. The second reflection layer 50 includes, for example, an Al layer, a Ti layer, or a stack of these layers. The method then proceeds to the step illustrated in FIG. 14.

A first opening 41 and a second opening 42 are formed through the first reflection layer 40 to expose a part of the first electrode 31 and a part of the second electrode 32 respectively. The first opening 41 and the second opening 42 are simultaneously formed by, for example, RIE. The first opening 41 is, for example, geometrically similar to the first electrode 31 in a plan view. The second opening 42 is, for example, geometrically similar to the second electrode 32 in a plan view. The first opening 41 is smaller in size than the first electrode 31 in a plan view. The second opening 42 is smaller in size than the second electrode 32 in a plan view. The first opening 41 and the second opening 42 may be formed separately in two stages, which will be described later.

The method then proceeds to the step illustrated in FIG. 15.

An insulation layer 61 is formed covering the first reflection layer 40 and the second reflection layer 50. The insulation layer 61 covers the lateral surface of the first reflection layer 40 that defines the first opening 41, the lateral surface of the first reflection layer 40 that defines the second opening 42, and the lateral surface of the semiconductor stack 10 that defines the groove 80. The insulation layer 61 is, for example, a $SiO_2$ layer. The exposed parts of the semiconductor stack 10 are covered and protected by the insulation layer 61. The insulation layer 61 is formed by, for example, sputtering or CVD.

Figure 17:
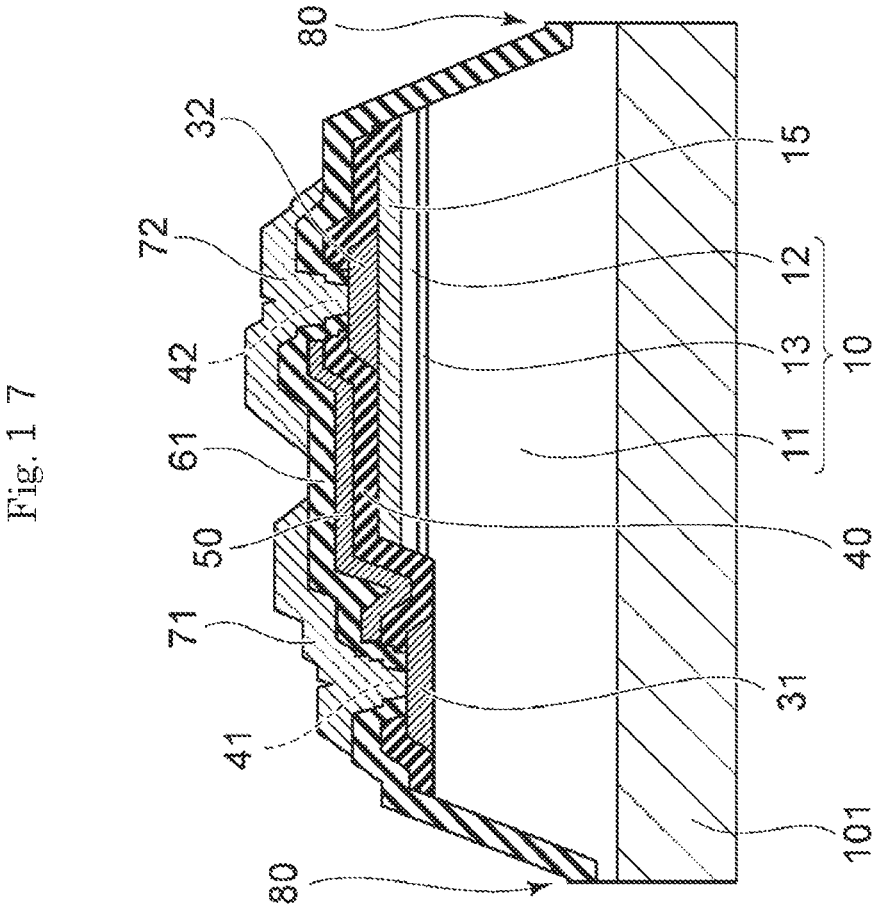
FIG. 17 is a schematic cross-sectional view taken along line XVII-XVII shown in FIG. 16.

The method then proceeds to the step illustrated in FIGS. 16 and 17.

FIG. 16 is a schematic plan view showing the same area as FIG. 12. FIG. 17 is a schematic cross-sectional view taken along line XVII-XVII shown in FIG. 16.

A first conductive member 71 is provided inside the first opening 41, and a second conductive member 72 is provided inside the second opening 42. The first conductive member 71 is in contact with the first electrode 31. The second conductive member 72 is in contact with the second electrode 32. The first conductive member 71 is further provided around the first opening 41 on the insulation layer 61. The second conductive member 72 is further provided around the second opening 42 on the insulation layer 61. The first conductive member 71 and the second conductive member 72 are isolated from each other on the insulation layer 61. The first conductive member 71 and the second conductive member 72 each have a thickness of, for example, from 0.1 μm to 5 μm. The first conductive member 71 and the second conductive member 72 have, for example, a substantially rectangular shape in a plan view, with a longer side having a length of from 10 μm to 100 μm. As an example, the first conductive member 71 is a cathode electrode, and the second conductive member 72 is an anode electrode.

The first conductive member 71 and the second conductive member 72 are simultaneously formed by, for example, sputtering. The first conductive member 71 and the second conductive member 72 include, for example, a Ti layer, a Rh layer, a Au layer, or a stack of any two of these layers.

The provision of the insulation layer 61 between the first reflection layer 40 and the first conductive member 71 and between the first reflection layer 40 and the second conductive member 72 can prevent the first conductive member 71 and the second conductive member 72 from being short-circuited to each other through the first reflection layer 40 even when the first reflection layer 40 contains a conductive material (e.g., $Nb_2O_5$).

In addition, the provision of the insulation layer 61 between the second reflection layer 50 and the first conductive member 71 and between the second reflection layer 50 and the second conductive member 72 can prevent the first conductive member 71 and the second conductive member 72 from being short-circuited to each other through the second reflection layer 50 even when the second reflection layer 50 is a metal layer.

The method continues with the steps illustrated in FIGS. 18 to 24A. The semiconductor stack 10 is shown upside down in FIGS. 18 to 24A when compared with the semiconductor stack 10 in drawings up to FIG. 17.

Figure 18:
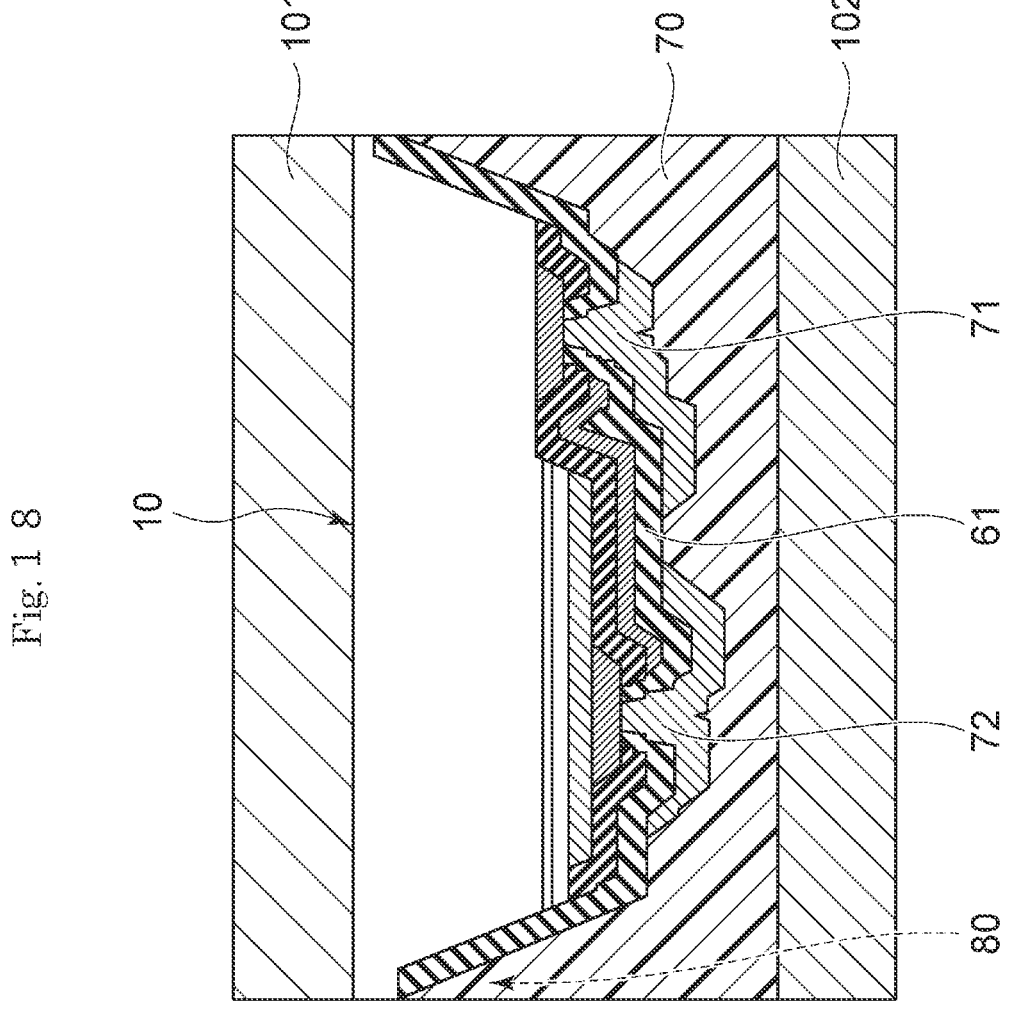
FIG. 18 is a schematic cross-sectional view illustrating a method of manufacturing light-emitting elements in accordance with an embodiment of the present disclosure.

In the step illustrated in FIG. 18, the semiconductor stack 10 and a second substrate 102 are attached together via a resin member 70. The resin member 70 is provided covering the first conductive member 71, the second conductive member 72, and the insulation layer 61 and further provided inside the groove 80. The resin member 70 is composed primarily of, for example, an epoxy resin, an acrylic resin, or a polyimide resin. Similarly to the first substrate 101, the second substrate 102 may be, for example, a sapphire, spinel, SiC, ZnS, ZnO, GaAs, or Si substrate.

Figure 19:
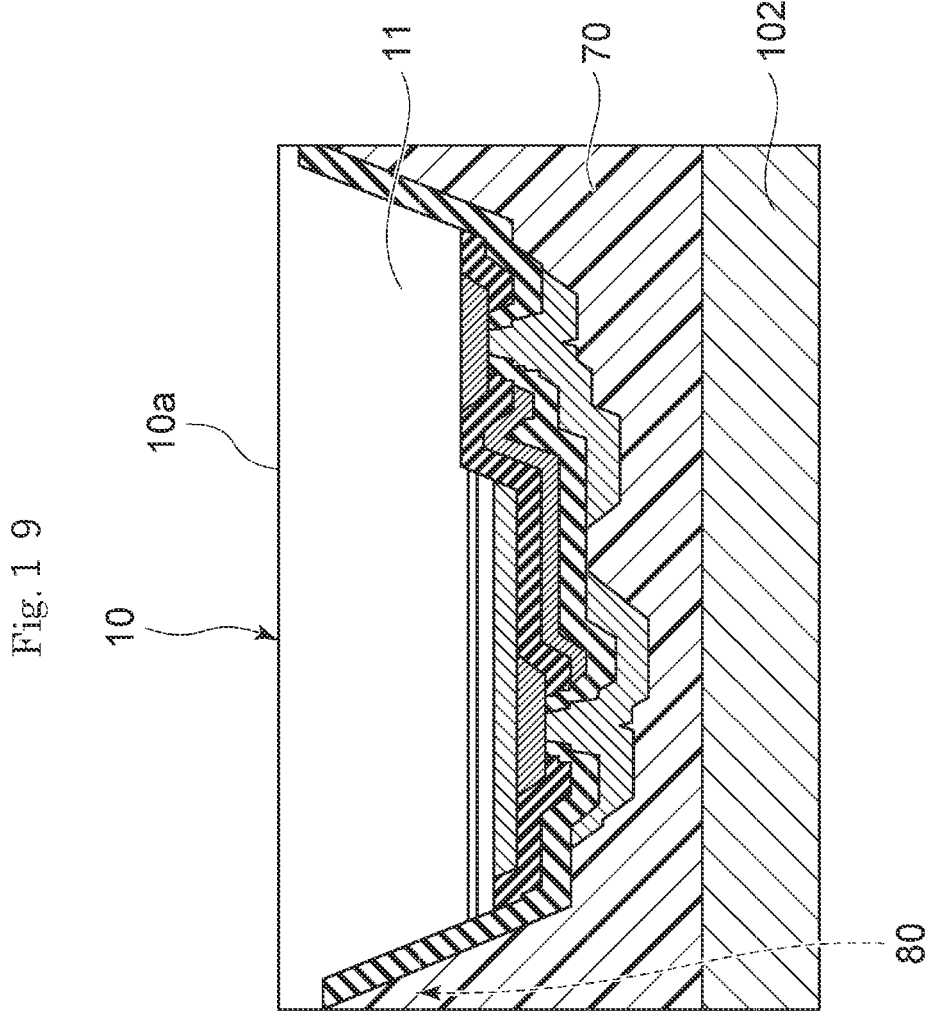
FIG. 19 is a schematic cross-sectional view illustrating a method of manufacturing light-emitting elements in accordance with an embodiment of the present disclosure.
Figure 2:
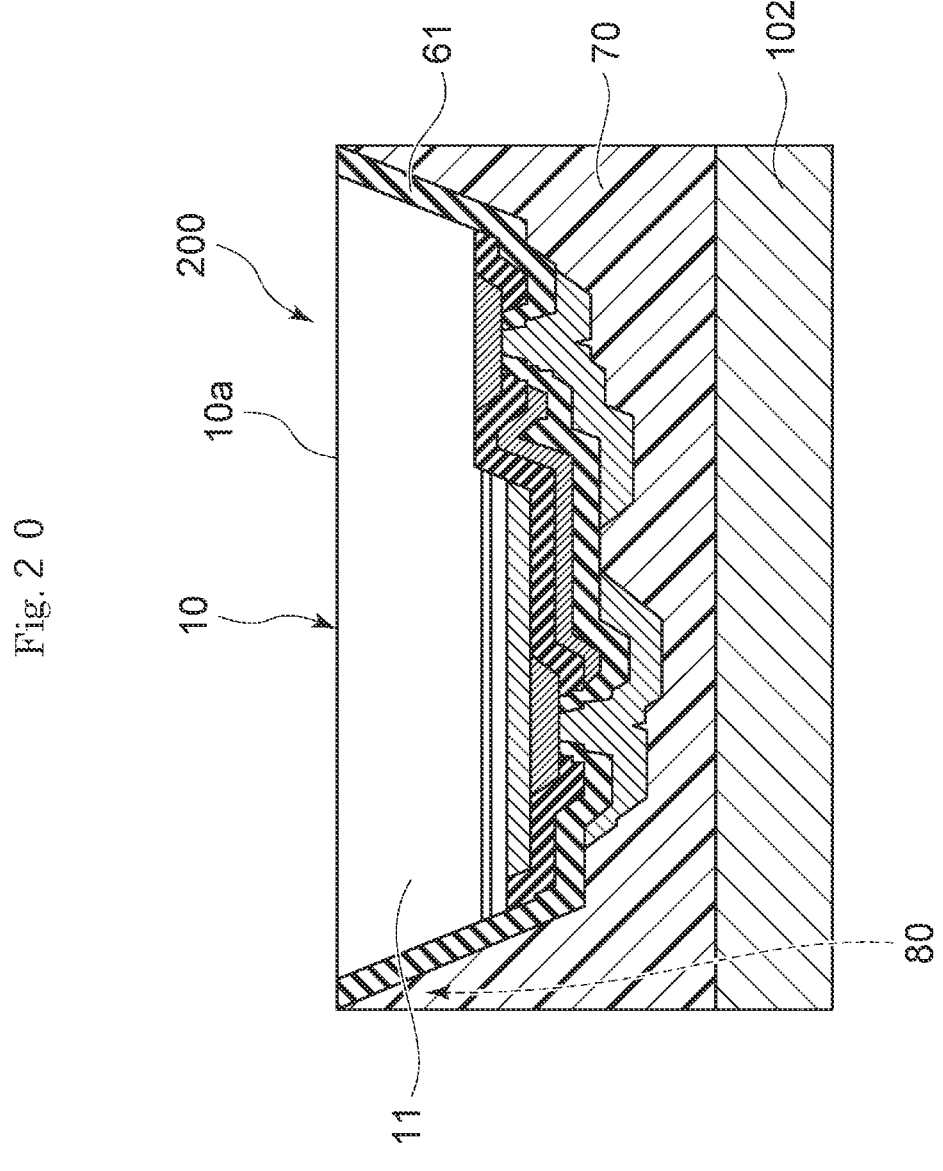
Figure 2:
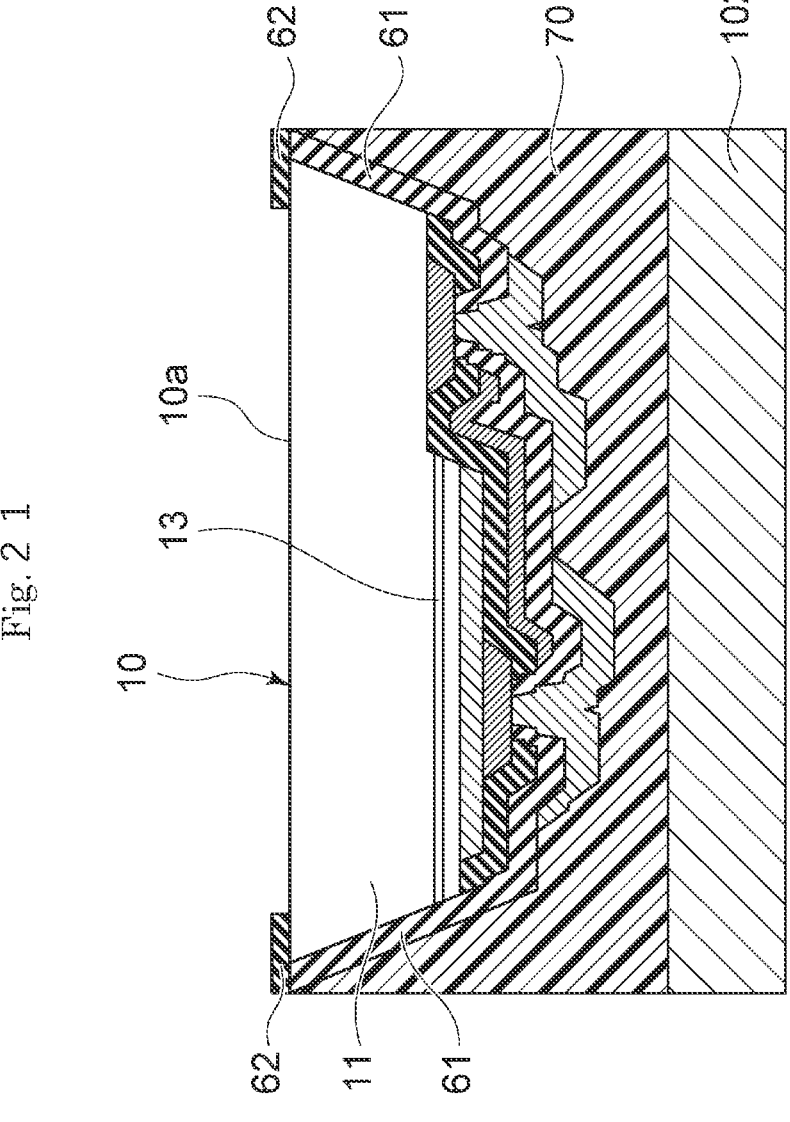
Figure 2:
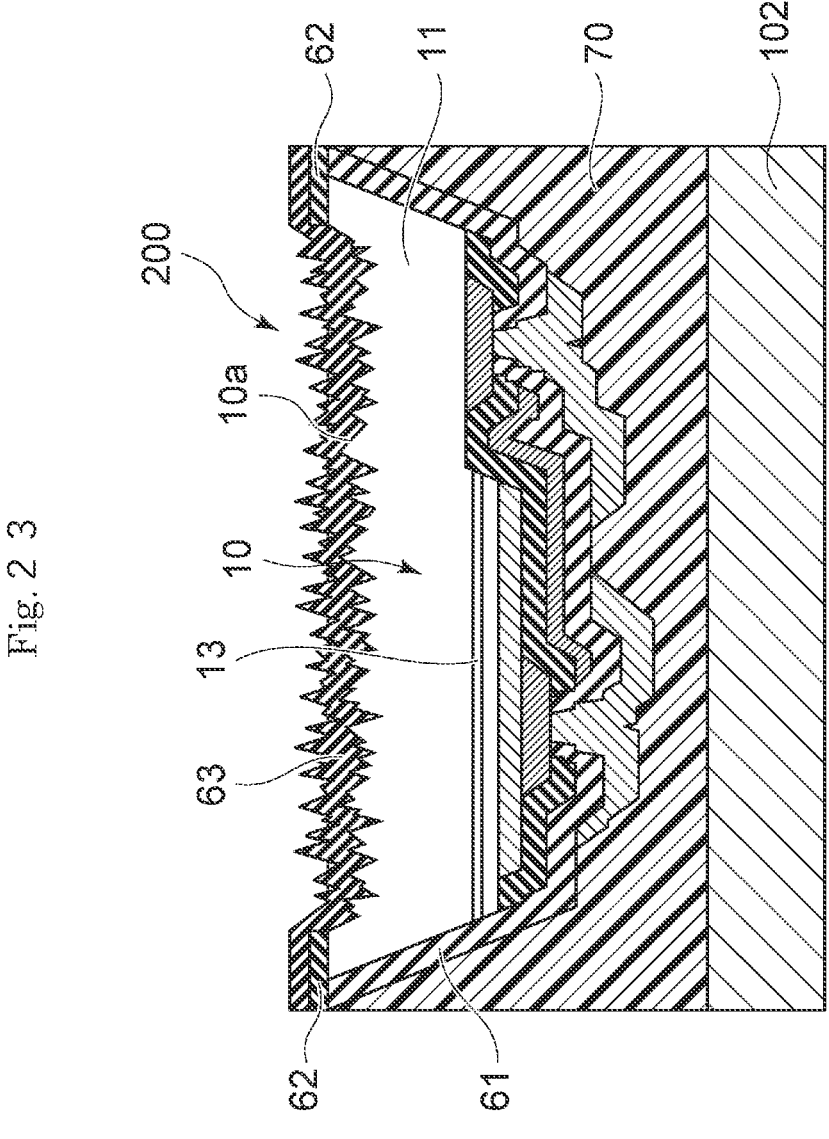
Figure 24:
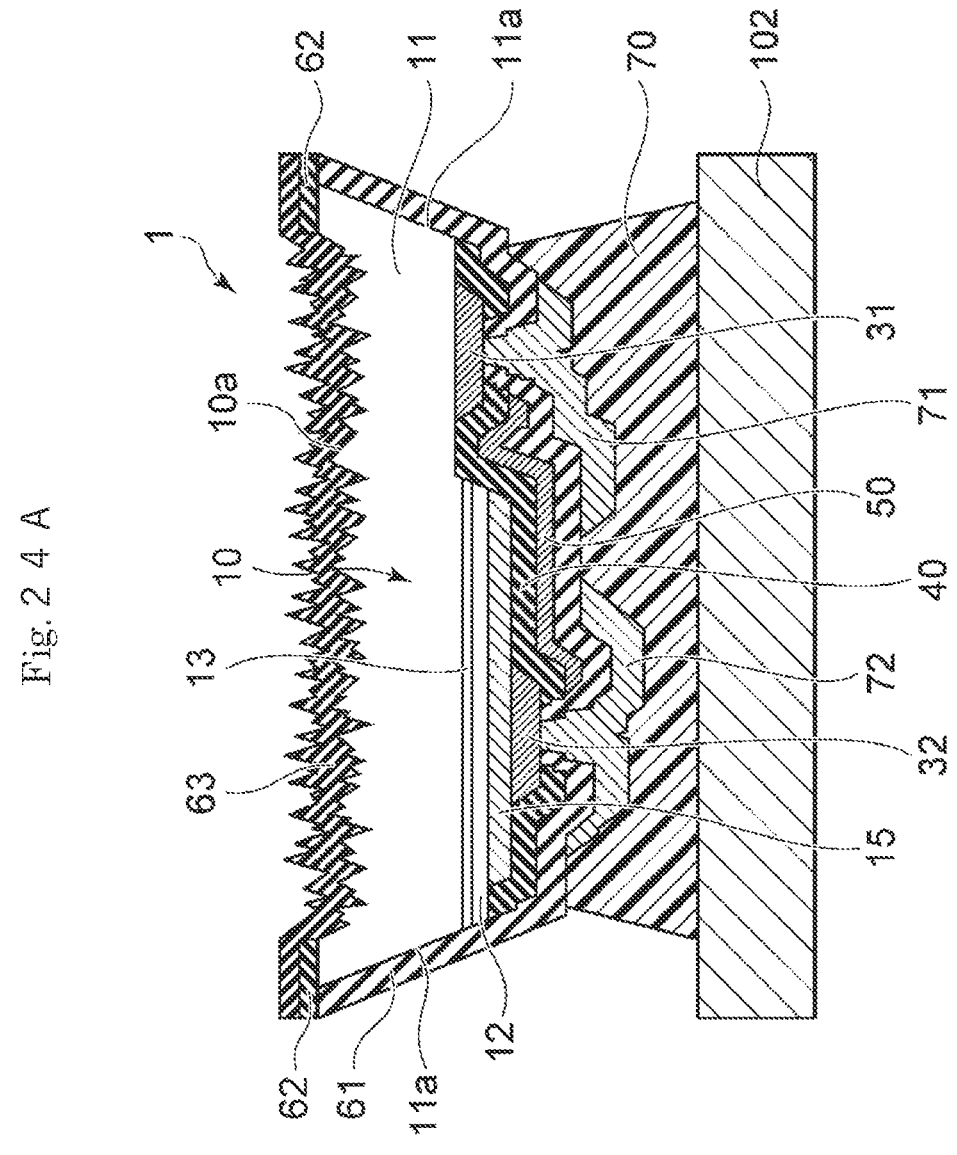
FIG. 24A is a schematic cross-sectional view illustrating a method of manufacturing light-emitting elements in accordance with an embodiment of the present disclosure.
FIG. 24B is a schematic bottom view of a light-emitting element in accordance with an embodiment of the present disclosure.
Figure 2:
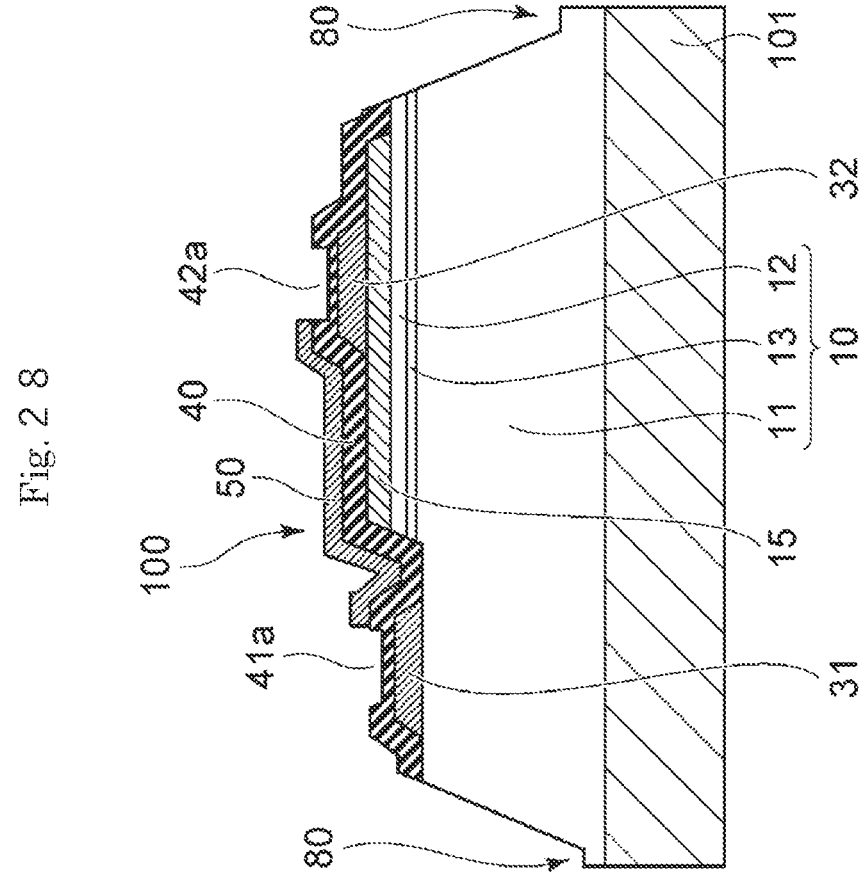
Figure 2:
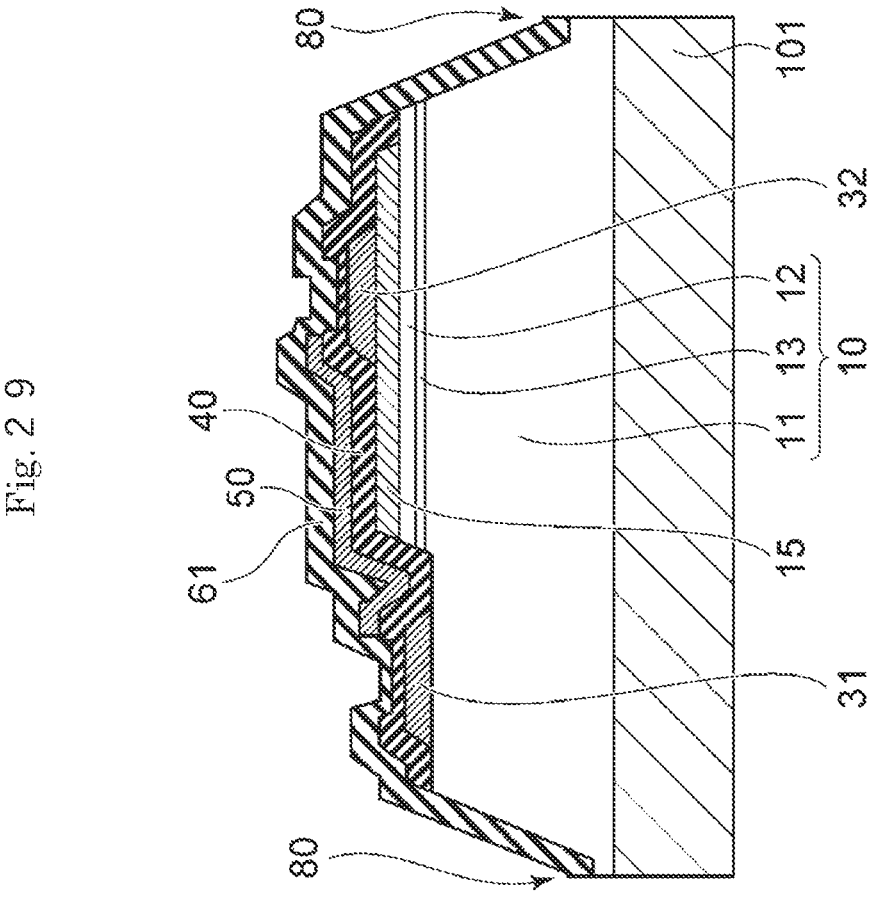

After attaching the semiconductor stack 10 and the second substrate 102 together, the first substrate 101 is removed to expose the surface of the first semiconductor layer 11 (the first surface 10a of the semiconductor stack 10) as shown in FIG. 19. The first substrate 101 used in growing the semiconductor stack 10 is removed by, for example, LLO (laser lift-off), grinding, polishing, or etching. In the present embodiment, the first substrate 101 is preferably removed by LLO because the first substrate 101 is a sapphire substrate.

The first surface 10a contains, for example, GaN, and the laser beam used in the LLO is, for example, deep-ultraviolet light. The laser beam sublimates Ga in GaN to lift the first substrate 101 off the first surface 10a. Referring back to the step of forming the groove 80 illustrated in FIG. 11, the semiconductor stack 10 is partially left over between the bottom surface of the groove 80 and the first substrate 101 in that step, so that the first surface 10a is present across the first substrate 101 in the LLO. This presence of the first surface 10a facilitates the lift-off of the first substrate 101 in the LLO.

Subsequently, the first surface 10a, now exposed, is polished by, for example, CMP (chemical mechanical polishing). The first surface 10a has an approximate maximum level difference of, for example, from 1 nm to 30 nm after the polishing. The first surface 10a is polished to leave no semiconductor stack 10 on the bottom of the groove 80 as shown in FIG. 20. By completely polishing the semiconductor stack 10 off the bottom of the groove 80, the semiconductor stack 10 is divided into a plurality of element sections 200.

After the semiconductor stack 10 is divided into a plurality of element sections 200, a first protective film 62 is formed covering the peripheral part of the first surface 10a as shown in FIG. 21. The first protective film 62 further covers the ends of the insulation layer 61 that reside on the first surface 10a, the insulation layer 61 covering the lateral surface of the first semiconductor layer 11. The first protective film 62 transmits the light from the active layer 13. The first protective film 62 includes, for example, a silicon oxide film. The first protective film 62, after being formed across the first surface 10a by, for example, sputtering, is removed, except for that part of the first protective film 62 which is present along the peripheral part of the first surface 10a, by RIE using a photoresist mask (not shown). This "peripheral part of the first surface 10a" refers to, for example, that part of the first surface 10a which is up to 10 μm, preferably up to 5 μm, from the edge thereof in a plan view.

After the first protective film 62 is formed, that part of the first surface 10a which is not covered by the first protective film 62 is roughened to form a rough, irregular surface out of the first surface 10a, as shown in FIG. 22. This roughening of the first surface 10a, which is the main light-extracting surface of the light-emitting element, can improve the light extraction efficiency of the light-emitting element. The first surface 10a, when roughened to a maximum level difference of, for example, approximately from 1 μm to 3 μm, can improve the light extraction efficiency of the light-emitting element. The first surface 10a is roughened, for example, by RIE using a chlorine-containing gas or by wet etching using an alkaline solution such as TMAH (tetramethylammonium hydroxide).

Roughening the entire first surface 10a is likely to result in breaking off parts of the first semiconductor layer 11 along the peripheral part of the first surface 10a. In the present embodiment, because the first protective film 62 covers the periphery of the first surface 10a contiguous with the lateral surface of the first semiconductor layer 11, the part of the first surface 10a along the peripheral part of the first semiconductor layer 11 remains unroughened. This structure can restrain the first semiconductor layer 11 from breaking off along the peripheral part of the first surface 10a. The photoresist mask used in removing the first protective film

62 except for the part thereof along the peripheral part of the first surface 10a is preferably left on the first protective film 62 along the peripheral part of the first surface 10a for use to perform the roughening of the first surface 10a. The presence of the photoresist mask facilitates ensuring that the first surface 10a remains unroughened along the peripheral part of the first semiconductor layer 11.

Referring to FIG. 23, a second protective film 63 is formed on the roughened first surface 10a. The second protective film 63 may be formed on the first protective film 62. The second protective film 63 transmits the light from the active layer 13. The second protective film 63 is, for example, a SiO$_2$ layer. The second protective film 63 is formed by, for example, sputtering. The second protective film 63 has a thickness of, for example, from 0.1 μm to 3 μm. The insulation layer 61, which covers the lateral surface of the first semiconductor layer 11, also transmits the light from the active layer 13.

After the second protective film 63 is formed, the parts of the resin member 70 that are located between the individual element sections 200 are removed by etching. This etching produces a plurality of light-emitting elements 1 separated from each other by empty spaces on the second substrate 102 as shown in FIG. 24A. FIG. 24B is a schematic bottom view of one of the light-emitting elements 1.

Each light-emitting element 1 is supported on the second substrate 102 with the resin member 70 interposed therebetween in such a manner that the surface of the light-emitting element 1 opposite from the first surface 10a faces the second substrate 102. The light-emitting element 1 can be removed from the second substrate 102 by, for example, irradiating laser light from the second substrate 102 side to partially remove the resin member 70. The light-emitting element 1 removed from the second substrate 102 is attached to another adhesive support substrate in such a manner that the surface thereof provided with the second protective film 63 is attached to another adhesive support substrate. The light-emitting element 1 may be removed from the second substrate 102 after being attached to another support substrate. The residual resin member 70 is then removed from the light-emitting element 1 by, for example, RIE to expose the first conductive member 71 and the second conductive member 72. The exposed first and second conductive members 71 and 72 serve as external connection terminals for bonding to a mounting board. The light-emitting element 1 is a light-emitting diode.

In the light-emitting element 1 in accordance with the present embodiment, the light from the active layer 13 is extracted to the outside primarily through the first surface 10a. The light from the active layer 13 is extracted to the outside also through lateral surface(s) 11a of the first semiconductor layer 11. The present embodiment provides the first reflection layer 40 on the surface opposite the first surface 10a and no reflection layer on the lateral surface 11a, thereby increasing the light extraction efficiency from the light-emitting element 1 to the outside. The proportion of the light extracted through the lateral surface 11a increases when the light-emitting element 1 is reduced in size. Therefore, this structure, lacking a reflection layer on the lateral surface 11a, is effective when the light-emitting element 1 has a length and width of 100 μm or shorter and highly effective when the light-emitting element 1 has a length and width of 60 μm or shorter.

The provision of a dielectric multilayer film as the first reflection layer 40 can reduce light absorptance and increase light reflectance, both in comparison with the provision of a metal layer. The additional provision of the second reflection layer 50 on the surface opposite the first surface 10$a$ can further increase light reflectance.

The process described below can be a first comparative example of the process of forming the structure including a reflection layer on the surface opposite the first surface 10$a$ and no reflection layer on the lateral surface 11$a$.

First Comparative Example

The element areas 100 of the semiconductor stack 10 are separated from each other by forming the groove 80. The lateral surface of the semiconductor stack 10 (first semiconductor layer 11) is exposed on the groove 80. Thereafter, a photoresist mask is formed covering the element area 100 (including the lateral surface of the first semiconductor layer 11) except for the surface opposite the first surface (light-extracting surface) 10$a$. A reflection layer is then formed by, for example, CVD or sputtering. The surface of the element area 100 opposite from the first surface 10$a$ is exposed in the openings of the photoresist mask. This reflection layer is formed on the surface of the element area 100 opposite from the first surface 10$a$ through the openings of the photoresist mask. The reflection layer is further formed on the photoresist mask. The photoresist mask is then lifted off to form a structure in which a reflection layer is formed on the surface of the element area 100 opposite from the first surface 10$a$ and no reflection layer on the lateral surface of the first semiconductor layer 11.

When the reflection layer is formed by the method in accordance with the first comparative example, the openings of the photoresist mask have a lateral surface having such a step-like or tapered shape that the material for the reflection layer cannot readily approach vicinity portions of the lateral surfaces of the openings. Thus, the reflection layer might be thin near the lateral surfaces of the openings. This reflection layer, having a small thickness at the end thereof, exhibits a reduced reflectance at the end.

In the present embodiment, the first reflection layer 40 is formed across the entire surface opposite the first surface 10$a$ without using a mask as shown in FIG. 7. Unlike the first comparative example, the present embodiment can restrain the first reflection layer 40 from becoming thin near the lateral surfaces of the openings of the mask. In other words, the present embodiment can restrain the first reflection layer 40 from becoming thin at the end thereof on each element area 100 shown in FIG. 11, thereby restraining reflectance from decreasing at the end thereof. In addition, the parts of the first reflection layer 40 that are exposed outside the first masks 91 are removed by anisotropic RIE. The present embodiment can therefore restrain the parts of the first reflection layer 40 covered by the first masks 91 from being subjected to side etching, thereby restraining the first reflection layer 40 from becoming thin at the end thereof.

Second Comparative Example

Next is descried a second comparative example of the process of forming the structure including a reflection layer on the surface opposite the first surface 10$a$ and no reflection layer on the lateral surface of the first semiconductor layer 11. The element areas 100 of the semiconductor stack 10 are separated from each other by forming the groove 80. Thereafter, a reflection layer is formed across the entire surface including the lateral surface of the first semiconductor layer 11. A mask is then formed covering the surface of the element area 100 opposite from the first surface 10$a$. The reflection layer formed on the lateral surface of the first semiconductor layer 11 is removed by etching. This method in accordance with the second comparative example presents difficulties in removing the reflection layer from the lateral surface of the first semiconductor layer 11. In other words, the method presents difficulties in removing the reflection layer formed in a region where there is a relatively large level difference like in the groove 80.

In the present embodiment, the first reflection layer 40 is formed before the groove 80, which separates the element areas 100, is formed, in other words, when the semiconductor stack 10 has no large level difference. Then, the first reflection layer 40 is removed in the etching by which the groove 80 is formed. The first reflection layer 40 is readily removed by RIE or like anisotropic etching on the parts of the first reflection layer 40 that are exposed outside the first masks 91 when there is no large level difference as shown in FIG. 9.

The third surface 10$c$ is preferably formed outside the element areas 100 (areas inside the dash-double-dot lines) in the step shown in FIG. 2. This structure can inhibit the narrow width stack of the second semiconductor layer 12 and the active layer 13 from remaining between the groove 80 and the third surface 10$c$ after the groove 80 is formed outside the element areas 100. This width of the stack refers to the length thereof measured in the lateral direction in FIG. 2. That can in turn restrain the narrow width stack from breaking off in the manufacture of the light-emitting elements.

The present embodiment forms the third surface 10$c$ both inside and outside the element areas 100 as shown in FIG. 2, thereby ensuring sufficient area of footprints for the first electrodes 31 disposition and at the same time enabling stable manufacturing of the light-emitting elements.

FIG. 26A is a schematic perspective view of the light-emitting element 1 as viewed from the side thereof on which the conductive members 71 and 72 are provided.

The lateral surface 11$a$ of the semiconductor stack 10 includes a lateral surface 11$b$ where the lateral surface contiguous with the third surface 10$c$ is recessed relative to the lateral surface contiguous with the second surface 10$b$. The recessed lateral surface 11$b$ is contiguous with the second area 80$b$ of the groove 80 shown in FIG. 11. The recessed lateral surface 11$b$ is contiguous from the third surface 10$c$ to the first surface 10$a$ (the surface facing downward in FIG. 26A).

Alternatively, the recessed lateral surface 11$b$ may not be contiguous all the way to the first surface 10$a$ as shown in FIG. 26B. In other words, the recessed lateral surface 11$b$ may be separated from the first surface 10$a$. The recessed lateral surface 11$b$ separated from the first surface 10$a$ allows for increases in the area of the first surface 10$a$. For instance, the length of the recessed lateral surface 11$b$ measured along the direction from the third surface 10$c$ to the first surface 10$a$ is 50% or less of the length of the lateral surface 11$a$ measured along the direction from the third surface 10$c$ to the first surface 10$a$.

FIGS. 25A and 25B are schematic bottom views of variation examples of the light-emitting element in accordance with the present embodiment.

The bottom surfaces of the light-emitting element shown in FIG. 25A and the aforementioned light-emitting element shown in FIG. 24B (the surfaces on which the conductive members 71 and 72 are provided) have an equal area. The extension of the third surface 10$c$ toward the center of the light-emitting element has a smaller length in the light-emitting element shown in FIG. 25A than in the light-emitting element shown in FIG. 24B. The third surface 10$c$ therefore has a smaller area in the light-emitting element shown in FIG. 25A than in the light-emitting element shown in FIG. 24B. Hence, the light-emitting, active layer 13 has a larger area in the light-emitting element shown in FIG. 25A than in the light-emitting element shown in FIG. 24B. In the light-emitting element shown in FIG. 25A, as a result of the shorter extension of the third surface 10c, the first electrode 31 on the third surface 10c is located away from the second electrode 32 and located closer to an opposite end of the light-emitting element from the second electrode 32 (the right side edge of the light-emitting element in FIG. 25A) than in the light-emitting element shown in FIG. 24B, and the second electrode 32 is located away from the first electrode 31 and located closer to an opposite end of the light-emitting element from the first electrode 31 (the left side edge of the light-emitting element in FIG. 25A) than in the light-emitting element shown in FIG. 24B. The first electrode 31 is separated from the second electrode 32 by a larger distance in the light-emitting element shown in FIG. 25A than in the light-emitting element shown in FIG. 24B, with the area of the bottom surface in FIG. 25A being equal to the area of the bottom surface in FIG. 24B. This particular structure enables the light-emitting element shown in FIG. 25A to better restrain high current distribution density than the light-emitting element shown in FIG. 24B. Additionally, the first electrode 31 and the second electrode 32 being located away from each other and closer to the respective edges can allow the second reflection layer 50 to have an increased area, thereby improving the extraction of light in the light-emitting element shown in FIG. 25A over the light-emitting element shown in FIG. 24B.

The first electrode 31, the opening in the first reflection layer 40, and the opening in the insulation layer 61, or the like may have a substantially rectangular shape in a plan view as in the light-emitting element shown in FIG. 25B. In the light-emitting element shown in FIG. 25B, there is provided no second electrode 32, and the current diffusion layer 15 is provided as the only electrode that is connected to the second semiconductor layer 12. The current diffusion layer 15 is in contact with the second semiconductor layer 12 and the second conductive member 72.

A detailed description is given next of the method of forming the second reflection layer 50 in the method of manufacturing light-emitting elements in accordance with the present embodiment.

FIGS. 27 to 30 are schematic cross-sectional views of a first example of the method of forming the second reflection layer 50.

Figure 27:
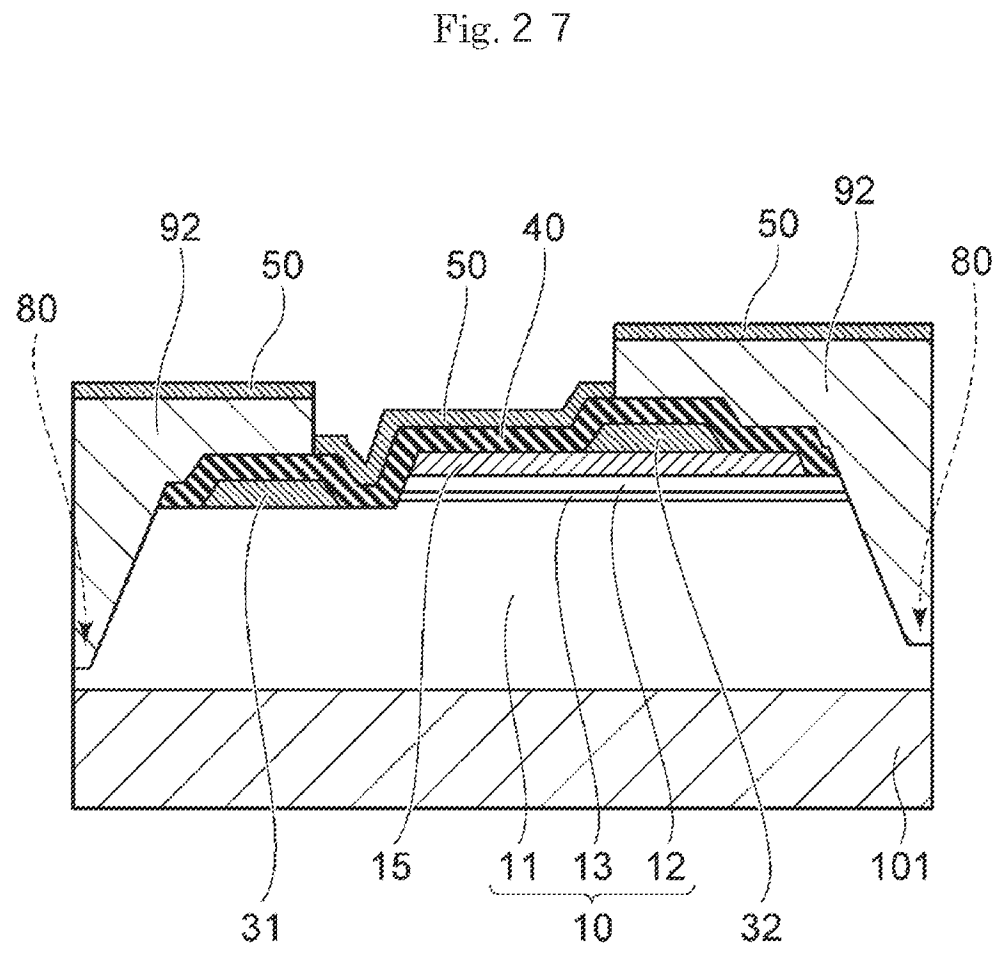

The step of forming the second reflection layer 50 includes, after forming the groove 80 by the aforementioned steps up to FIG. 13, a step of forming a second mask 92 that covers the groove 80 as shown in FIG. 27. The second mask 92 is further formed on the parts of the first reflection layer 40 where openings will be formed on the electrodes 31 and 32. The second mask 92 is, for example, a photoresist mask.

The second reflection layer 50 is then formed on the first reflection layer 40 exposed outside the second mask 92. The second reflection layer 50 is further formed on the second mask 92. The second reflection layer 50 is formed by, for example, sputtering.

After the second reflection layer 50 is formed, the second mask 92 is removed. The second reflection layer 50 remains on the regions exposed outside the second mask 92 (above the element areas 100), whilst the parts of the second reflection layer 50 that reside on the second mask 92 are removed, as shown in FIG. 28. If the unnecessary parts of the second reflection layer 50 are removed by RIE, the ends of the remaining parts of the second reflection layer 50 might be exposed to the gas used in RIE and hence corroded. The first example can restrain the ends of the remaining second reflection layer 50 from being corroded by the gas used in RIE, resulting in restraining reflectance decrease.

After the second mask 92 is removed, the parts of the first reflection layer 40 where first openings will be formed on the first electrodes 31 are etched out to form first depressions 41a. Each first depression 41a has a bottom surface that does not reach the first electrode 31. The parts of the first reflection layer 40 where second openings will be formed on the second electrodes 32 are also etched out to form second depressions 42a. Each second depression 42a has a bottom surface that does not reach the second electrode 32. The first depressions 41a and the second depressions 42a are simultaneously formed by, for example, RIE.

Thereafter, the insulation layer 61 is formed covering the groove 80, the first reflection layer 40, and the second reflection layer 50 as shown in FIG. 29.

Figure 30:
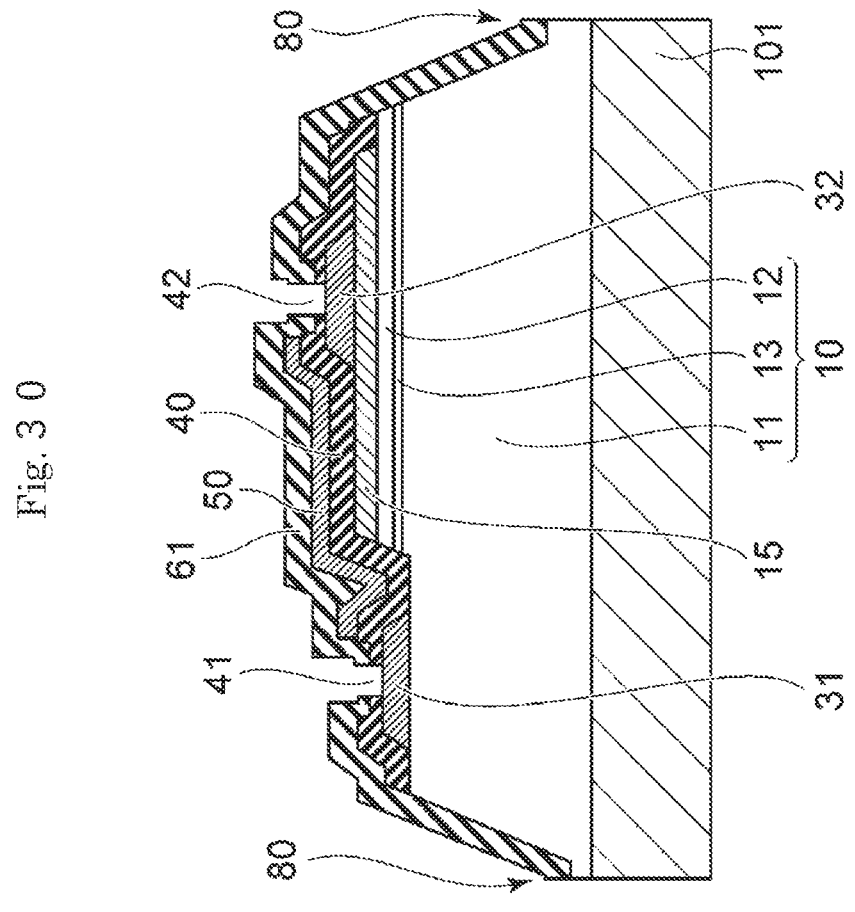
FIG. 30 is a schematic cross-sectional view illustrating a method of manufacturing light-emitting elements in accordance with an embodiment of the present disclosure.
Figure 3:
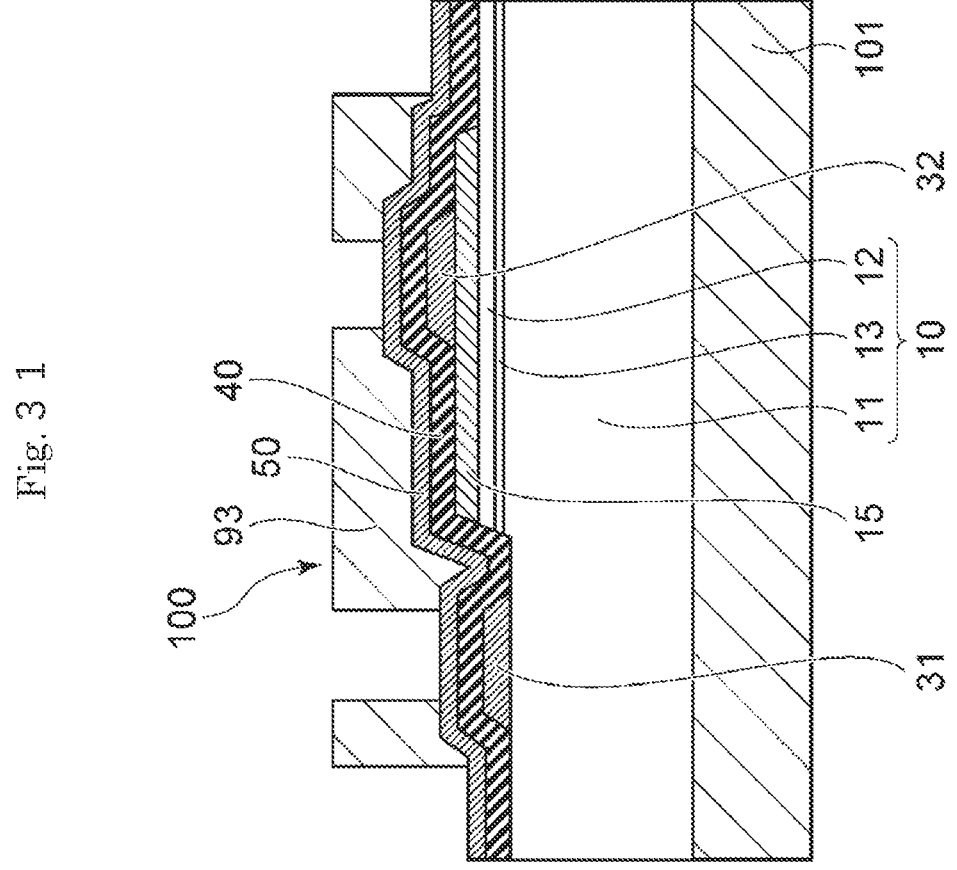
Figure 3:
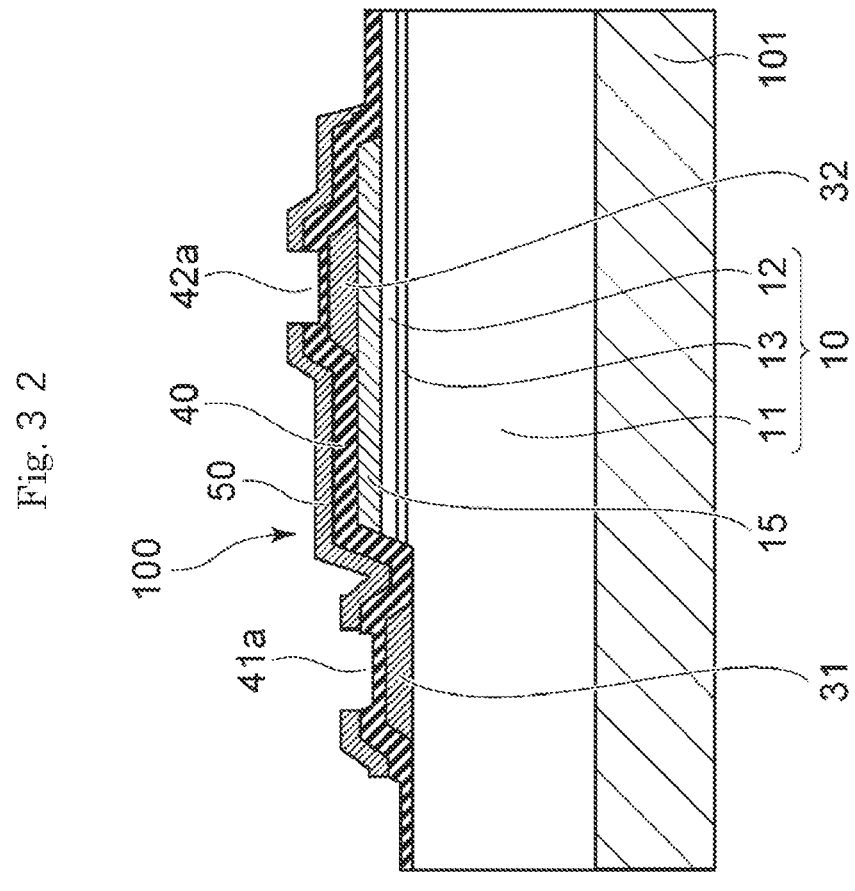

After the insulation layer 61 is formed, the insulation layer 61 above the first electrodes 31 is removed, and the first reflection layer 40 on the first electrodes 31 is also removed. Thus, the first openings 41 are formed through the first reflection layer 40, reaching the first electrodes 31, as shown in FIG. 30. The first electrode 31 is at least partially exposed from the first reflection layer 40 and the insulation layer 61. In addition, the insulation layer 61 above the second electrodes 32 is removed, and the first reflection layer 40 on the second electrodes 32 is also removed. Thus, the second openings 42 are formed through the first reflection layer 40, reaching the second electrodes 32. The second electrode 32 is at least partially exposed from the first reflection layer 40 and the insulation layer 61. The first openings 41 and the second openings 42 are simultaneously formed by, for example, RIE.

After the openings 41 and 42 are formed, the method proceeds to the aforementioned steps shown in FIG. 16 and the subsequent drawings, including the step of forming the conductive members 71 and 72 inside the openings 41 and 42.

In the method shown in FIGS. 27 to 30, the step of forming the openings 41 and 42 through the first reflection layer 40 is divided into two stages. In other words, the step of forming the openings 41 and 42 includes: a first step of forming the depressions 41a and 42a in the first reflection layer 40, and a second step of removing the remaining first reflection layer 40 from the bottoms of the depressions 41a and 42a.

This method exposes the electrodes 31 and 32 from the first reflection layer 40 after the insulation layer 61 is formed. Therefore, the method can restrain the conductive material of the etched and splashed parts of electrodes 31 and 32 in RIE from adhering to conductive materials in the first reflection layer 40 (e.g., $Nb_2O_5$) and to the second reflection layer 50 (metal layer). Hence, the method can restrain the electrodes 31 and 32 from being short-circuited to each other through, for example, the first reflection layer 40 and the second reflection layer 50.

The first reflection layer 40 is thinned down by etching in the aforementioned first step before the insulation layer 61 is formed. This thinning can reduce the thickness of the lateral surfaces of the first reflection layer 40 that are not covered by the insulation layer 61 and that are defining the openings 41 and 42 formed in the aforementioned second step. In other words, the thinning can reduce the quantity of the electrode material that adheres to the lateral surfaces of the first reflection layer 40 defining the openings 41 and 42.

In this situation, the parts of the first reflection layer 40 that are in contact with the electrodes 31 and 32 preferably contain a relatively highly insulating material and have a relatively large thickness of from 100 nm to 500 nm. This particular structure can facilitate imparting a relatively high insulation to the first reflection layer 40 exposed in the bottoms of the depressions 41*a* and 42*a*. That can in turn facilitate covering, with the insulation layer 61, the lateral surface of the dielectric multilayer film on a relatively thick, highly insulating member in the first reflection layer 40 inside the depressions 41*a* and 42*a*. Hence, the structure can, in exposing the electrodes 31 and 32 from the first reflection layer 40, restrain the etched conductive material of the electrodes 31 and 32 from being splashed in RIE and adhering to a conductive member in the first reflection layer 40 (e.g., $Nb_2O_5$) and to the second reflection layer 50 (metal layer), thereby better restraining short-circuiting between the electrodes 31 and 32. The "relatively highly insulating member" in this context refers to, for example, $SiO_2$ and SiON.

FIGS. 31 to 33 and 35 are schematic cross-sectional views of a second example of the method of forming the second reflection layer 50.

After the first reflection layer 40 is formed in the afore-mentioned step shown in FIG. 7 and before the groove 80 is formed, the second reflection layer 50 is formed contigu-ously on the first reflection layer 40 as shown in FIG. 31. The second reflection layer 50 is formed across the entire surface of the first reflection layer 40 inside and between the element areas 100.

A third mask 93 is then formed covering the parts of the second reflection layer 50 that are located on the element areas 100. The third mask 93 is not formed on the parts of the first reflection layer 40 where openings will be formed on the electrodes 31 and 32. The third mask 93 is, for example, a photoresist mask.

The second reflection layer 50 is then removed from regions which is not covered by parts of the third mask 93 (regions exposed outside the third mask 93) by RIE. The second reflection layer 50 is remained on parts of the first reflection layer 40 in the element areas 100 as shown in FIG. 32.

In this second example, the step of forming the openings 41 and 42 through the first reflection layer 40 is divided into two stages as in the first example. Therefore, after the second reflection layer 50 on the electrodes 31 and 32 is removed by RIE using the third mask 93, the first reflection layer 40 on the electrodes 31 and 32 is successively etched to the intermediate position on the way through the thickness thereof by RIE using the third mask 93. The first depressions 41*a* and the second depressions 42*a* are thus formed in the first reflection layer 40.

In the second example, after the second reflection layer 50 is formed on the first reflection layer 40, the unnecessary parts of the second reflection layer 50 are removed by RIE using the third mask 93. The remaining second reflection layer 50, including the ends thereof, is therefore formed with high precision.

Figure 33:
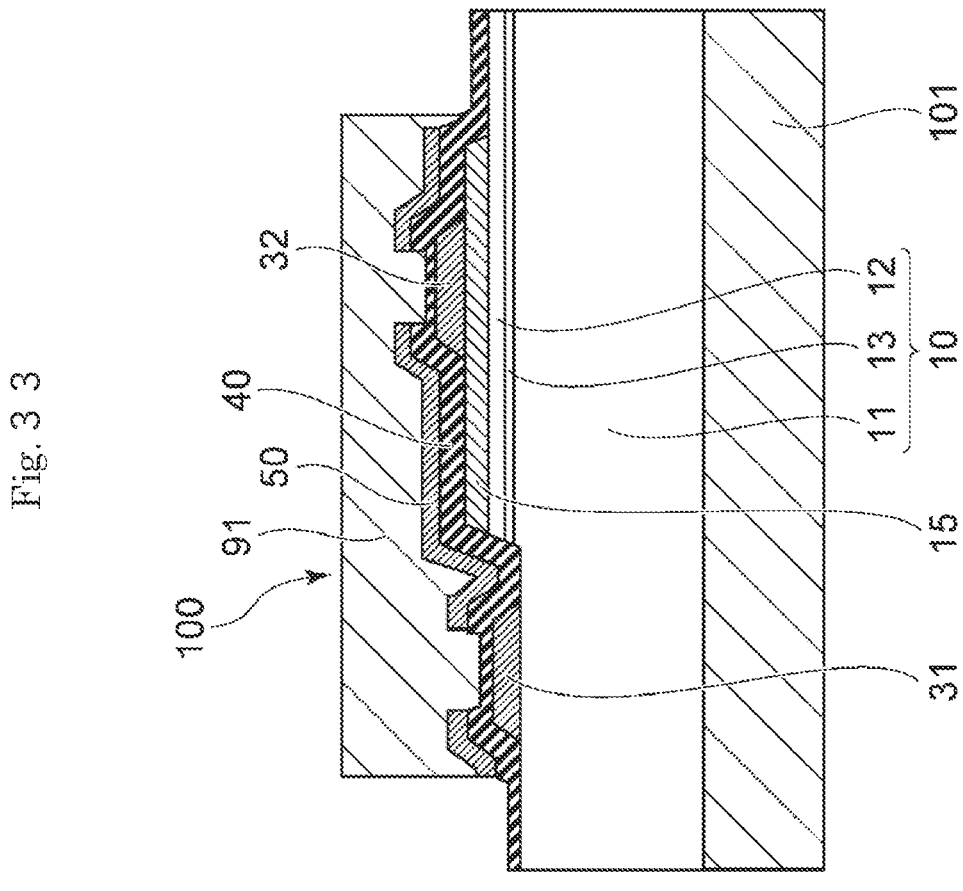
FIG. 33 is a schematic cross-sectional view illustrating a method of manufacturing light-emitting elements in accordance with an embodiment of the present disclosure.
Figure 3:
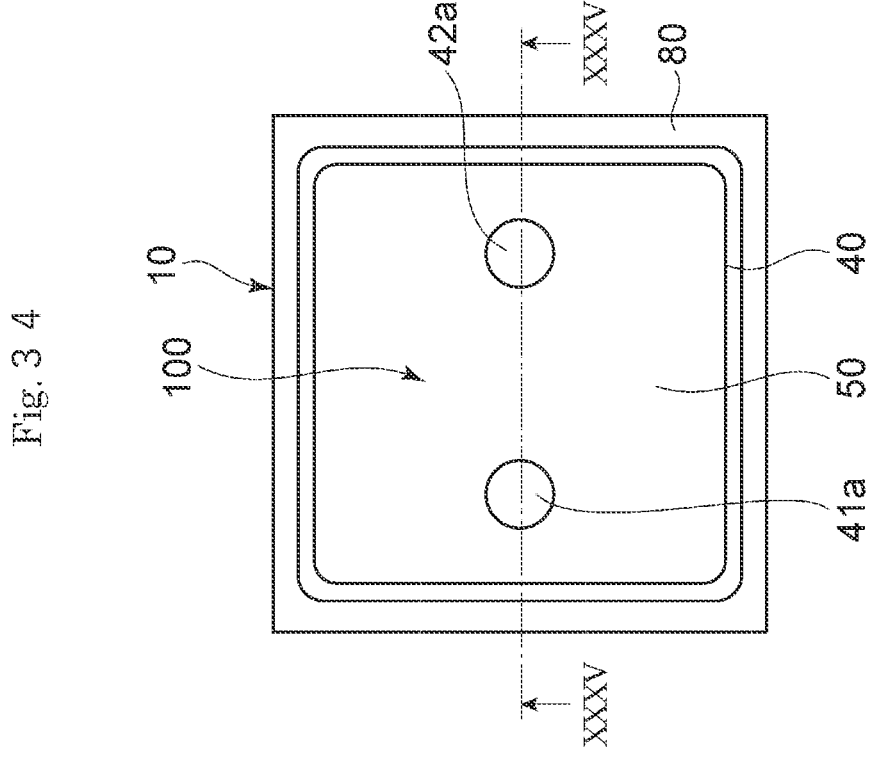
Figure 3:
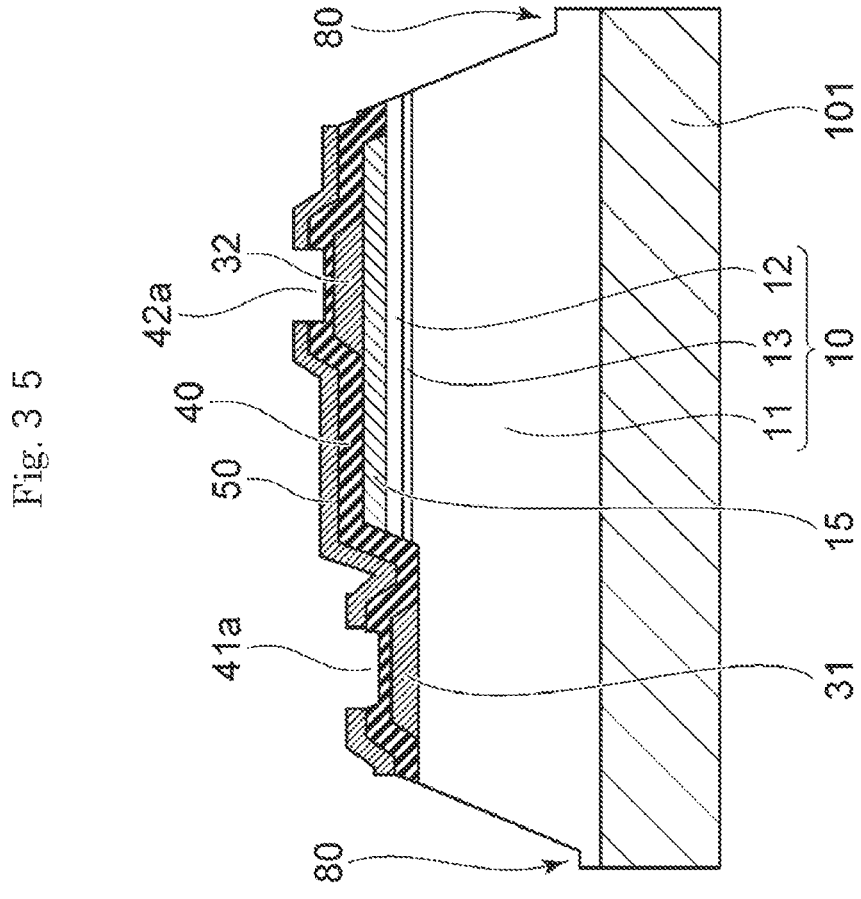
Figure 3:
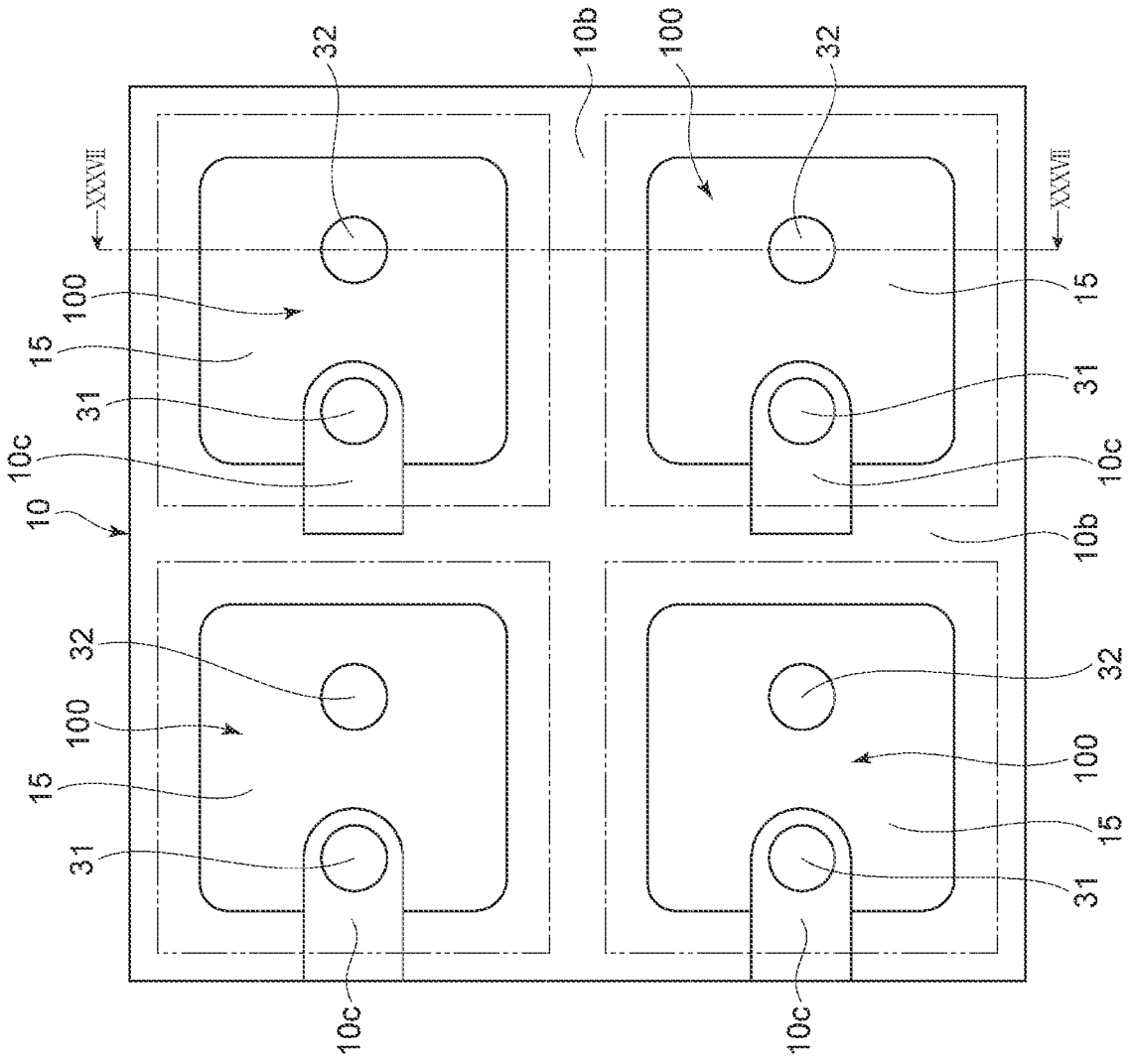

Thereafter, the first masks 91 are formed covering the second reflection layer 50 and the first reflection layer 40 on the element areas 100 as shown in FIG. 33. The first reflection layer 40 and the semiconductor stack 10 exposed outside the first masks 91 are then removed by RIE. The groove 80 is thus formed in the semiconductor stack 10 as shown in FIGS. 34 and 35. FIG. 34 is a schematic plan view showing the same area as FIG. 12. FIG. 35 is a schematic cross-sectional view taken along line XXXV-XXXV shown in FIG. 34.

In the RIE by which the groove 80 is formed, the third mask 93 used in the preceding step may be remained without being removed. The first masks 91 are formed so as to cover the third mask 93. The first masks 91 might not be formed in an appropriate manner on the third mask 93 because the surface of the third mask 93 can be damaged in the etching that removes parts of the second reflection layer 50. The first masks 91 are therefore preferably formed after the third mask 93 is removed.

The method then proceeds to the step of forming the insulation layer 61 shown in FIG. 29 and the step of forming the first openings 41 and the second openings 42 shown in FIG. 30. The method further proceeds to the steps shown in FIG. 16 and subsequent drawings.

Figure 38:
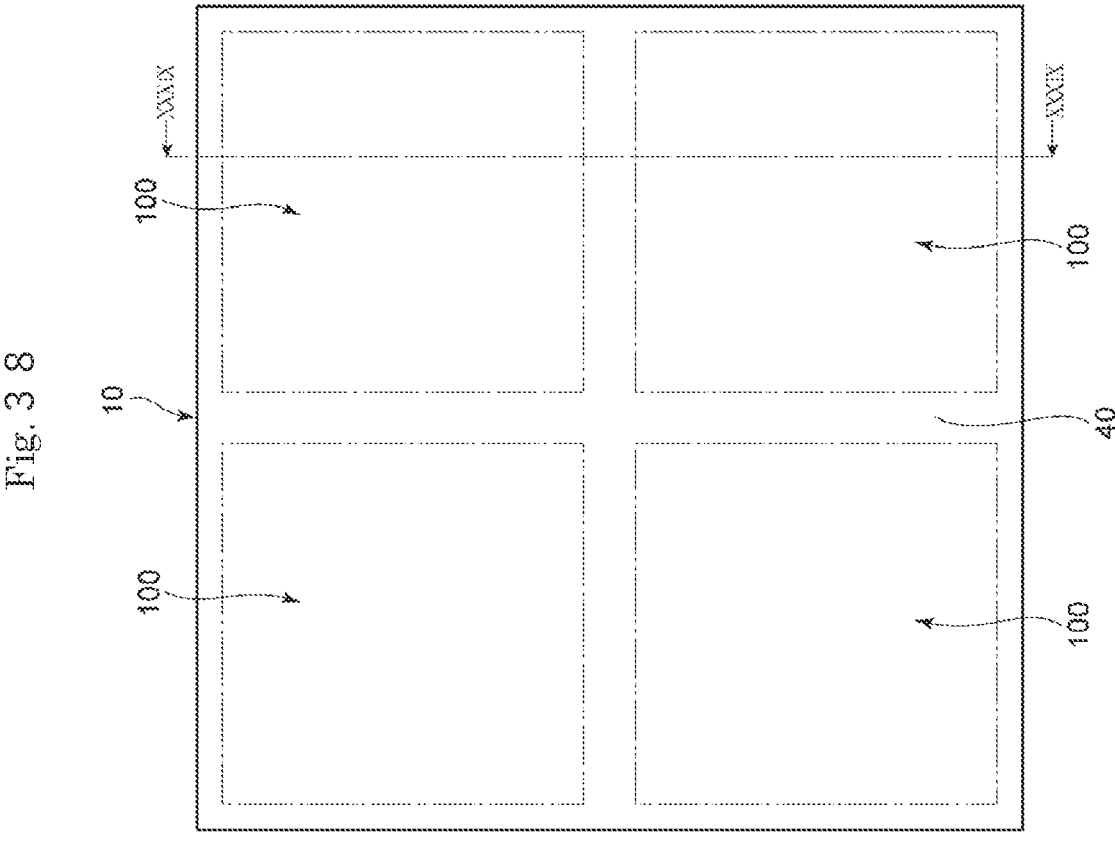
FIG. 38 is a schematic plan view illustrating a method of manufacturing light-emitting elements in accordance with an embodiment of the present disclosure.
Figure 3:
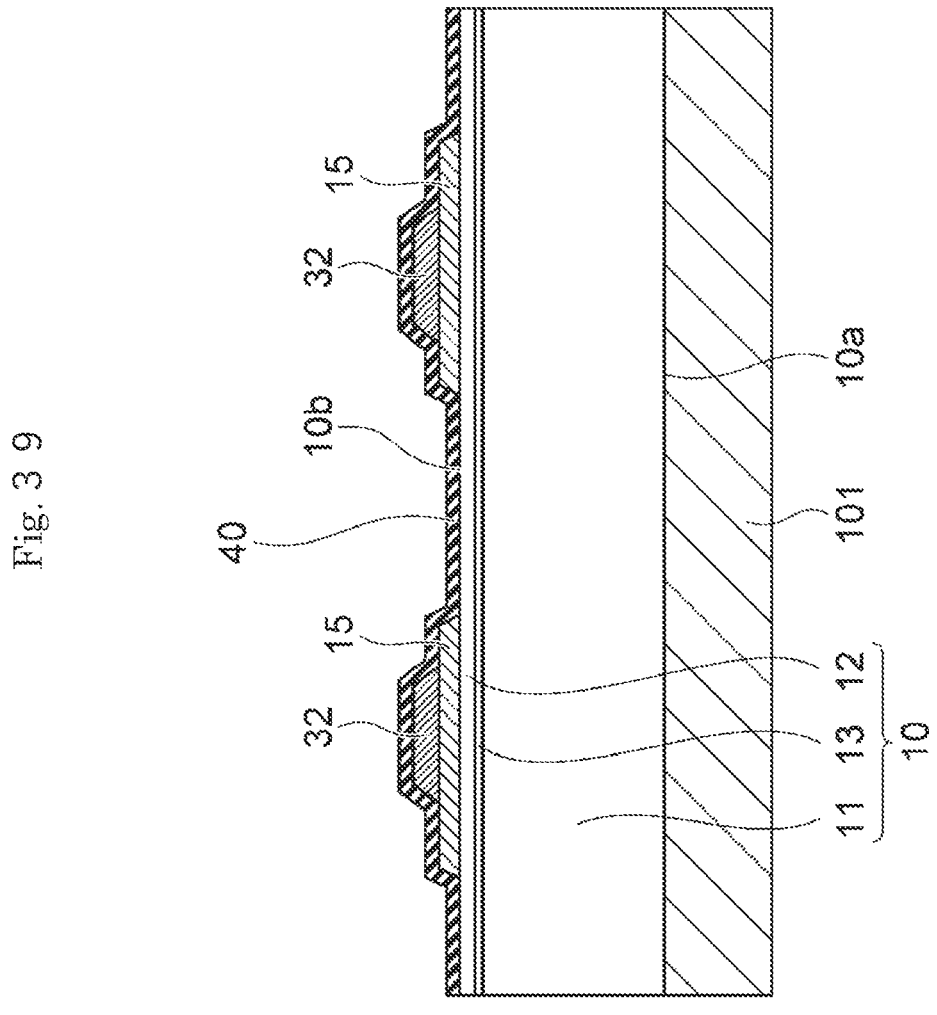
Figure 40:
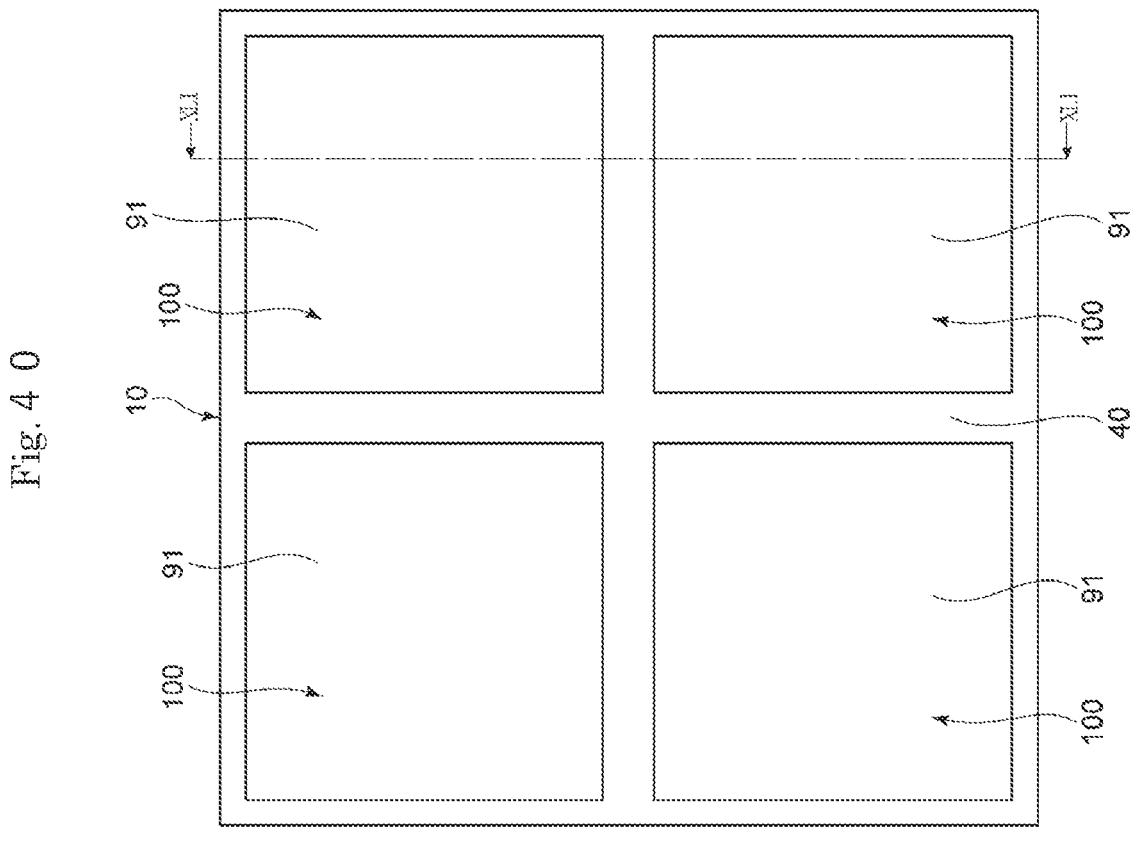
FIG. 40 is a schematic plan view illustrating a method of manufacturing light-emitting elements in accordance with an embodiment of the present disclosure.
Figure 4:
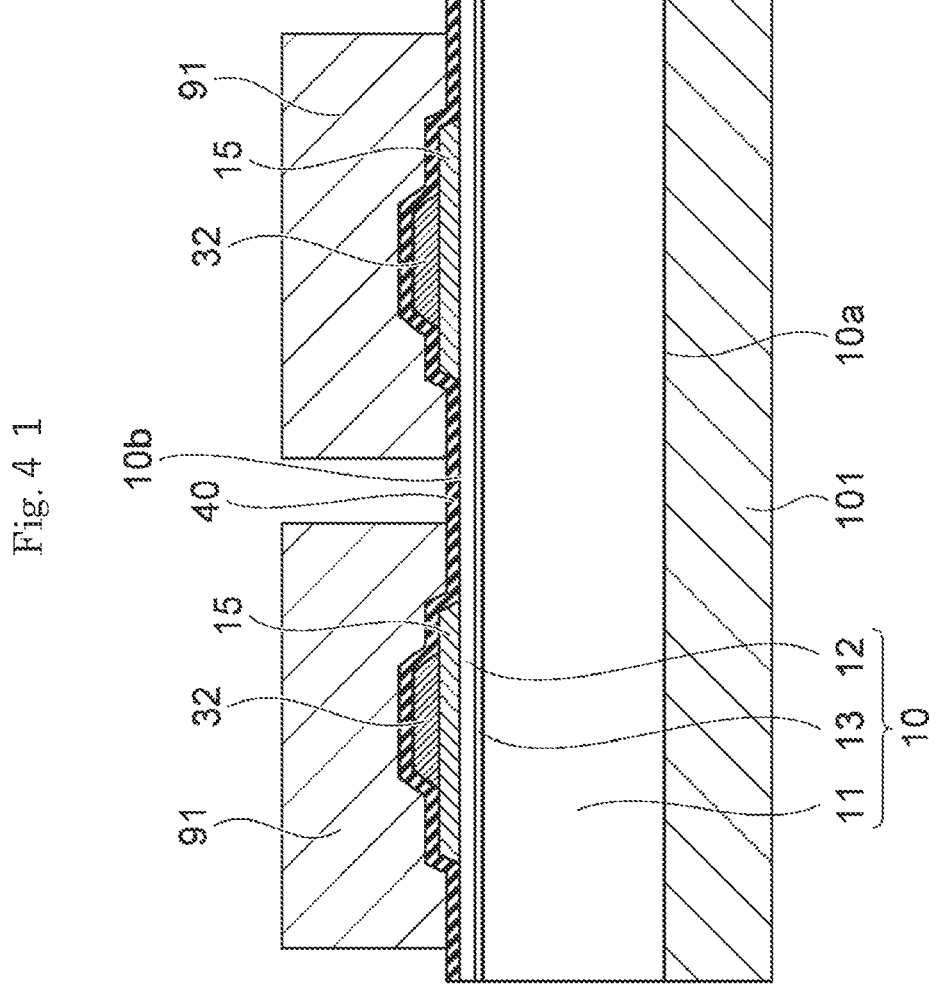

FIGS. 4, 6, 8, and 10 described earlier show two element areas 100. In contrast, FIGS. 36, 38, 40, and 42 show four element areas 100. FIG. 36 is a schematic plan view illus-trating the same step as FIG. 4. FIG. 37 is a schematic cross-sectional view taken along line XXXVII-XXXVII shown in FIG. 36. FIG. 38 is a schematic plan view illustrating the same step as FIG. 6. FIG. 39 is a schematic cross-sectional view taken along line XXXIX-XXXIX shown in FIG. 38. FIG. 40 is a schematic plan view illustrating the same step as FIG. 8. FIG. 41 is a schematic cross-sectional view taken along line XLI-XLI shown in FIG. 40. FIG. 42 is a schematic plan view illustrating the same step as FIG. 10. FIG. 43 is a schematic cross-sectional view taken along line XLIII-XLIII shown in FIG. 42.

As shown in FIG. 5 described earlier, the second semi-conductor layer 12 and the active layer 13 are partially removed from the second semiconductor layer 12 side to expose the third surface 10*c*, which is a part of the first semiconductor layer 11, from the second semiconductor layer 12 and the active layer 13 in each of the element areas 100.

In the wafer prior to the formation of the first reflection layer 40, the third surface 10*c*, which is a part of the first semiconductor layer 11, is exposed in a region where the first electrode 31 is located, as shown in FIGS. 4 and 36. In the wafer prior to the formation of the first reflection layer 40, the second surface 10*b*, which is the top surface of the second semiconductor layer 12, is exposed on the top surface of the semiconductor stack 10 except for on the third surface 10*c*.

After the steps shown in FIGS. 4, 5, 36, and 37, the method proceeds to the steps of forming the first reflection layer 40 as shown in FIGS. 6, 7, 38, and 39.

The first reflection layer 40 is formed contiguously on the exposed part of the second semiconductor layer 12 (second surface 10*b*) in each element area 100, the exposed part of the first semiconductor layer 11 (third surface 10*c*) in the element area 100, and the exposed part of the second semiconductor layer 12 (second surface 10*b*) between each pair of adjacent element areas 100.

The lateral surface(s) of the active layer 13, which are exposed when the third surface 10*c* is formed by partially removing the second semiconductor layer 12 and the active layer 13 from the second semiconductor layer 12 side, are covered by the first reflection layer 40 as shown in FIG. 7. In the regions where no third surface 10*c* is provided, the lateral surfaces of the active layer 13 are neither exposed nor covered by the first reflection layer 40 as shown in FIG. 39.

After the steps shown in FIGS. 6, 7, 38, and 39, the method proceeds to the steps of forming the first masks 91 as shown in FIGS. 8, 9, 40, and 41.

The first masks 91 cover the first reflection layer 40 above the element areas 100. The first masks 91 are disposed separately from each other in a plan view. The footprint of the first mask 91 covering the first reflection layer 40 approximately matches the element area 100. The parts of the first reflection layer 40 that are located between the adjacent element areas 100 (i.e., between the adjacent first masks 91) are exposed outside the first masks 91.

After the steps shown in FIGS. 8, 9, 40, and 41, the method proceeds to the steps of forming the groove 80 as shown in FIGS. 10, 11, 42, and 43.

The first reflection layer 40, the second semiconductor layer 12, and the active layer 13 are removed in the regions between each pair of adjacent first masks 91 to expose the first semiconductor layer 11. The groove 80 is thus formed in the semiconductor stack 10 between the adjacent element areas 100.

Referring to FIGS. 11 and 43, the lateral surfaces of the active layer 13 are exposed from the semiconductor stack 10 in the formation of the groove 80. Therefore, in accordance with the present embodiment, light-emitting elements can be formed in each of which: the first reflection layer 40 is provided on the second surface 10*b* side and the third surface 10*c* side opposite the first surface (main light-extracting surface) 10*a*, and no first reflection layer 40 is provided across substantially the entire lateral surfaces of the active layer 13. This structure can increase the light extraction efficiency from the light-emitting element to the outside. The first reflection layer 40 is provided on parts of the lateral surfaces of the active layer 13 as will be described later.

As described above, the light-emitting element 1 shown in FIG. 24A is obtained by the method of manufacturing the light-emitting elements 1 in accordance with the present embodiment. The light-emitting element 1 includes the semiconductor stack 10. The semiconductor stack 10 includes: the first semiconductor layer 11, the second semiconductor layer 12, and the active layer 13 between the first semiconductor layer 11 and the second semiconductor layer 12, as shown in FIG. 3. The semiconductor stack 10 has: the first surface 10*a*, the second surface 10*b*, located opposite the first surface 10*a*, where the second semiconductor layer 12 is exposed from the semiconductor stack 10, and the third surface 10*c*, located opposite the first surface 10*a*, where the first semiconductor layer 11 is partially exposed from the second semiconductor layer 12 and the active layer 13. The semiconductor stack 10 has the lateral surface 11*a* connecting the first surface 10*a* and the second surface 10*b* and connecting the first surface 10*a* and the third surface 10*c* as shown in FIG. 24A.

The light-emitting-element 1 further includes: the first electrode 31 electrically connected to the third surface 10*c*, the second electrode 32 electrically connected to the second surface 10*b*, and the first reflection layer 40 covering the second surface 10*b* and the third surface 10*c* and not provided on the lateral surface 11*a*. In other words, the lateral surfaces of the active layer 13, located on the lateral surface 11*a* of the semiconductor stack 10, are exposed from the first reflection layer 40. As shown in, for example, FIGS. 11 and 24A, the parts of the lateral surfaces of the active layer 13 which are located on a surface connecting the second surface 10*b* and the third surface 10*c* are covered by the first reflection layer 40. In contrast, the lateral surfaces of the active layer 13 located in the surface that connects the second surface 10*b* and the third surface 10*c* are covered by the first reflection layer 40, and parts of the lateral surfaces of the active layer 13 located on the lateral surface 11*a* of the semiconductor stack 10, these parts thereof occupying most parts of the lateral surfaces of the active layer 13, are exposed from the first reflection layer 40.

The first reflection layer 40 has an end part including an end surface connecting to the lateral surface 11*a* of the semiconductor stack 10. This end part of the first reflection layer 40 refers to that part of the first reflection layer 40 which is up to, for example, 0.6 μm from the end surface connecting to the lateral surface 11*a* of the semiconductor stack 10.

As described earlier, in the present embodiment, the first reflection layer 40 is formed across the entire surface opposite the first surface 10*a* without using a mask. The first reflection layer 40 can hence have a substantially constant thickness throughout the entire first reflection layer 40, except for the end thereof. This particular structure can restrain reflectance from decreasing due to the reduced thickness of the first reflection layer 40. The thickness of the first reflection layer 40 is measured perpendicular to the surface of a member that is in contact with the first reflection layer 40. A "substantially constant thickness" may have a variation within 10 nm.

Embodiments of the present invention have been described by means of specific examples. However, the present invention is by no means limited to these examples. The present invention encompasses all suitable modifications by a person skilled in the art based on the aforementioned embodiments. One skilled in the art can conceive of variations and modifications without departing from the spirit of the invention. These variations and modifications are also within the scope of the present invention.

What is claimed is:

1. A method of manufacturing light-emitting elements, the method comprising:

providing a wafer, which comprises:

providing a semiconductor stack, the semiconductor stack comprising:

a first semiconductor layer, an active layer on the first semiconductor layer, and a second semiconductor layer on the active layer, wherein the semiconductor stack comprises a plurality of element areas each comprising a part of the first semiconductor layer, a part of the active layer, and a part of the second semiconductor layer, forming a first electrode on each part of the first semiconductor layer, and forming a second electrode on each part of the second semiconductor layer;

forming a first reflection layer contiguously on or above (i) the second semiconductor layer in the plurality of element areas and (ii) the second semiconductor layer located between adjacent ones of the plurality of element areas, wherein the first reflection layer is formed contiguously on or above each first electrode and on or above each second electrode;

forming a plurality of first masks covering first parts of the first reflection layer that are on or above the second semiconductor layer in the plurality of element areas; and forming a groove that is located between the adjacent ones of the plurality of element areas and surrounds each of the plurality of element areas, wherein the step of forming the groove comprises removing a second part of the first reflection layer and a part of the semiconductor stack both located between adjacent ones of the plurality of first masks to expose the first semiconductor layer.

2. The method according to claim 1, wherein, in the step of forming the groove, the first reflection layer and the semiconductor stack are partially removed by reactive ion etching.

3. The method according to claim 2, wherein:
the step of forming the groove comprises:
removing the second part of the first reflection layer located between the adjacent ones of the plurality of first masks by etching using a fluorine-containing gas, and
removing the part of the semiconductor stack located between the adjacent ones of the plurality of first masks by etching using a chlorine-containing gas.

4. The method according to claim 1, further comprising:
after the step of forming the first reflection layer, forming a second reflection layer on or above the first reflection layer.

5. The method according to claim 4, wherein:
the step of forming the second reflection layer comprises, after forming the groove:
forming a second mask covering the groove,
forming the second reflection layer on or above the second mask and on or above the first reflection layer, and
removing the second mask and the second reflection layer on or above the second mask.

6. The method according to claim 4, wherein:
the step of forming the second reflection layer comprises, before forming the groove:
forming the second reflection layer contiguously on or above the first reflection layer,
forming a third mask covering first parts of the second reflection layer above the plurality of element areas, and
removing a second part of the second reflection layer from regions located between parts of the third mask.

7. The method according to claim 1, further comprising:
forming openings to expose each first electrode and each second electrode through the first reflection layer; and
forming a conductive member in each of the openings.

8. The method according to claim 7, further comprising:
before the step of forming the conductive members, forming an insulation layer covering the first reflection layer, lateral surfaces of the first reflection layer that define the openings, and a lateral surface of the semiconductor stack that defines the groove.

9. The method according to claim 1, wherein:
the first reflection layer comprises a dielectric multilayer film.

10. The method according to claim 1, wherein:
the step of providing the wafer comprises sequentially forming the first semiconductor layer, the active layer, and the second semiconductor layer on a first substrate; and
the method further comprises:
after forming the groove, attaching the semiconductor stack and a second substrate via a resin member; and
after the step of attaching the semiconductor stack and the second substrate, removing the first substrate to expose a surface of the first semiconductor layer.

11. A method of manufacturing light-emitting elements, the method comprising:
providing a wafer, which comprises:
providing a semiconductor stack comprising:
a first semiconductor layer,
an active layer on the first semiconductor layer, and
a second semiconductor layer on the active layer,
wherein the semiconductor stack comprises a plurality of element areas each comprising a part of the first semiconductor layer, a part of the active layer, and a part of the second semiconductor layer,
forming a first electrode on each part of the first semiconductor layer, and
forming a second electrode on each part of the second semiconductor layer;
forming a first reflection layer contiguously on or above (i) the second semiconductor layer in the plurality of element areas (ii) the second semiconductor layer located between adjacent ones of the plurality of element areas, wherein the first reflection layer is formed contiguously on or above each first electrode and on or above each second electrode;
forming a plurality of first masks covering first parts of the first reflection layer that are on or above the second semiconductor layer in the plurality of element areas;
forming a groove between the adjacent ones of the plurality of element areas, which comprises removing a second part of the first reflection layer and a part of the semiconductor stack both located between adjacent ones of the plurality of first masks to expose the first semiconductor layer;
forming openings to expose each first electrode and each second electrode through the first reflection layer;
forming an insulation layer covering the first reflection layer, lateral surfaces of the first reflection layer that define the openings, and a lateral surface of the semiconductor stack that defines the groove; and
after the step of forming the insulation layer, forming a conductive member in each of the openings.

* * * * *